(12) United States Patent
Helvajian et al.

(10) Patent No.: US 10,160,061 B2
(45) Date of Patent: Dec. 25, 2018

(54) SYSTEMS AND METHODS FOR MODIFYING ACOUSTIC WAVES BASED ON SELECTIVE HEATING

(71) Applicant: The Aerospace Corporation, El Segundo, CA (US)

(72) Inventors: Henry Helvajian, Pasadena, CA (US); Anthony J. Manzo, Palmdale, CA (US)

(73) Assignee: The Aerospace Corporation, El Segundo, CA (US)

( * ) Notice: Subject to any disclaimer, the term of this patent is extended or adjusted under 35 U.S.C. 154(b) by 158 days.

(21) Appl. No.: 15/237,408

(22) Filed: Aug. 15, 2016

(65) Prior Publication Data

US 2018/0043473 A1 Feb. 15, 2018

(51) Int. Cl.

| | |
|---|---|
| *B23K 26/351* | (2014.01) |
| *G01K 11/22* | (2006.01) |
| *C23C 16/48* | (2006.01) |
| *G01H 9/00* | (2006.01) |
| *B23K 15/00* | (2006.01) |
| *H05B 3/06* | (2006.01) |
| *G10K 11/36* | (2006.01) |
| *B23K 26/50* | (2014.01) |
| *C23C 14/22* | (2006.01) |

(Continued)

(52) U.S. Cl.
CPC ........ *B23K 26/351* (2015.10); *B23K 15/0006* (2013.01); *B23K 26/50* (2015.10); *C23C 14/22* (2013.01); *C23C 16/483* (2013.01); *G01H 9/00* (2013.01); *G10K 11/26* (2013.01); *G10K 11/36* (2013.01); *H05B 3/06* (2013.01); *F24V 30/00* (2018.05)

(58) Field of Classification Search
CPC .... G01H 9/00; B23K 26/351; B23K 26/0054; B23K 15/0006; G01K 11/36; G01N 29/38; G01N 29/24; G01N 29/44; G01N 29/07; G01N 29/40; C23C 14/22; C23C 16/483

See application file for complete search history.

(56) References Cited

U.S. PATENT DOCUMENTS

| | | |
|---|---|---|
| 4,249,418 A | 2/1981 | Ebata |
| 4,399,441 A | 8/1983 | Vaughan et al. |
| 4,633,715 A | 1/1987 | Monchalin |

(Continued)

FOREIGN PATENT DOCUMENTS

| | | |
|---|---|---|
| DE | 4205832 A1 | 9/1993 |
| JP | H09199426 A | 7/1997 |

OTHER PUBLICATIONS

Seminario et al., "Clustering Effects on Discontinuous Gold Film NanoCells," J. Nanosci. Nanotech. 4(7):1-11 (2004).

(Continued)

*Primary Examiner* — Helen C Kwok
(74) *Attorney, Agent, or Firm* — Jones Day

(57) ABSTRACT

An acoustic wave is modified by initiating excitation of an acoustic wave from a first location on a substrate to a second location on the substrate and selectively heating the second location of the substrate so as to alter a property of the second location. With such arrangements, the altered property of the second location modifies the acoustic wave to result in a modified acoustic wave that is propagated from the second location to a third location on the substrate. Related apparatus, systems, and methods are also described.

42 Claims, 17 Drawing Sheets

(51) Int. Cl.
G10K 11/26 (2006.01)
F24V 30/00 (2018.01)

(56) References Cited

U.S. PATENT DOCUMENTS

| | | | |
|---|---|---|---|
| 4,966,459 A | 10/1990 | Monchalin | |
| 5,080,491 A | 1/1992 | Monchalin et al. | |
| 5,136,172 A * | 8/1992 | Nakata | G01N 21/1702 250/559.39 |
| 5,208,643 A | 5/1993 | Fair | |
| 5,286,313 A * | 2/1994 | Schultz | G10K 15/046 148/508 |
| 5,410,405 A | 4/1995 | Schultz et al. | |
| 5,446,452 A | 8/1995 | Litton | |
| 5,569,502 A | 10/1996 | Koinuma et al. | |
| 5,721,615 A | 2/1998 | McBride et al. | |
| 5,724,138 A * | 3/1998 | Reich | G01N 29/12 356/492 |
| 5,804,727 A * | 9/1998 | Lu | G01H 5/00 73/159 |
| 6,078,397 A * | 6/2000 | Monchalin | G01B 11/0691 356/502 |
| 6,256,100 B1 | 7/2001 | Banet et al. | |
| 6,628,404 B1 * | 9/2003 | Kelley | H05B 6/06 356/502 |
| 6,795,198 B1 | 9/2004 | Fuchs et al. | |
| 7,434,989 B2 | 10/2008 | Solie | |
| 7,526,357 B2 | 4/2009 | Livingston et al. | |
| 7,541,103 B2 | 6/2009 | Leu | |
| 7,884,047 B2 | 2/2011 | Labrousse et al. | |
| 8,603,608 B2 | 12/2013 | Shin et al. | |
| 9,144,962 B2 | 9/2015 | Lee et al. | |
| 9,303,309 B2 | 4/2016 | Helvajian | |
| 9,315,679 B2 | 4/2016 | Kitano | |
| 9,945,032 B2 | 4/2018 | Helvajian | |
| 2002/0055012 A1 | 5/2002 | Chou et al. | |
| 2003/0094032 A1 | 5/2003 | Baklanov et al. | |
| 2003/0150272 A1 * | 8/2003 | Janik | G01B 11/0666 73/655 |
| 2007/0131871 A1 | 6/2007 | Chang et al. | |
| 2008/0072674 A1 * | 3/2008 | Ume | G01N 29/0618 73/627 |
| 2009/0200894 A1 * | 8/2009 | Kando | H03H 3/08 310/313 B |
| 2010/0089615 A1 | 4/2010 | Kuchiyama et al. | |
| 2010/0102280 A1 | 4/2010 | Ford et al. | |
| 2010/0154549 A1 * | 6/2010 | Fomitchov | G01N 29/041 73/643 |
| 2011/0064943 A1 | 3/2011 | Wang | |
| 2011/0122727 A1 * | 5/2011 | Gleitman | E21B 36/02 367/81 |
| 2011/0314921 A1 * | 12/2011 | Tsujita | A61B 5/0095 73/657 |
| 2014/0199550 A1 * | 7/2014 | Helvajian | C23C 14/22 428/412 |
| 2014/0227477 A1 | 8/2014 | Cola et al. | |
| 2016/0182009 A1 * | 6/2016 | Bhattacharjee | H01L 41/047 310/313 B |
| 2016/0208383 A1 | 7/2016 | Helvajian | |
| 2017/0227408 A1 * | 8/2017 | Helvajian | G01K 11/22 |

OTHER PUBLICATIONS

Strano et al., "Surface roughness analysis, modelling and prediction in selective laser melting," J. Mater. Process. Technol. 213:589-597 (2013).
Takahashi et al., "New Thin Film Fabrication Technique Using a Substrate Excited by SAW," IEEE Transactions on Magnetics 26(5):1453-1455 (1990).
The American Heritage Dictionary, "Bandwidth," 2011 (1 page).
Tokiy et al., "Temperature Dependence of Elastic Moduli of Submicrocrystalline Copper," Phys. Solid State 56(5):1002-1005 (2014).
Valiveti et al., "Influence of Thermal Annealing and Ion Irradiation on Zinc Silicate Phases in Nanocomposite ZnO—SiOx Thin Films," Appl. Surf. Sci. 317:1075-1079 (2014).
Van Bael et al., "Micro-CT-based improvement of geometrical and mechanical controllability of selective laser melted Ti6AI4V porous structures," Mater. Sci. Eng., A 528:7423-7431 (2011).
Varshni, "Temperature Dependence of the Elastic Constants," Phys. Rev. B 2(10):3952-3958 (1970).
Xuan et al., "Particle focusing in microfluidic devices," Microfluid Nanofluid 6:1-16 (2010).
Yadroitsev et al., "Surface Morphology in Selective Laser Melting of Metal Powders," Physics Procedia 12:264-270 (2011).
Zhu et al., "Temperature and Strain-Rate Dependence of Surface Dislocation Nucleation," Phys. Rev. Lett. 100 (2):025502-1 through 025502-4 (2008) (Epub Jan. 15, 2008).
United States Patent and Trademark Office, Final Office Action for U.S. Appl. No. 13/739,879, dated Aug. 11, 2015 (32 pages).
United States Patent and Trademark Office, Non-Final Office Action for U.S. Appl. No. 13/739,879, dated Feb. 11, 2015 (28 pages).
United States Patent and Trademark Office, Notice of Allowance for U.S. Appl. No. 13/739,879, dated Dec. 29, 2015 (14 pages).
Ahn et al., "Representation of surface roughness in fused deposition modeling," J. Mater. Process. Technol. 209:5593-5600 (2009).
Bachari et al., "Structural and Optical Properties of Sputtered ZnO Films," Thin Solid Films 348:165-172 (1999).
Bao et al., "Transport Powder and Liquid Samples by Surface Acoustic Waves," Proc. of SPIE 7:72910M through 1-72910M-7 (2009).
Bhatia, "Scattering of High-Frequency Sound Waves in Polycrystalline Materials," J. Acoust. Soc. Am. 31(1):16-23 (1959).
Briggs, "Acoustic microscopy—a summary," Rep. Prog. Phys. 55:851-909 (1992).
Cammack, R. et al., "Oxford Dictionary of Biochemistry and Molecular Biology—Adsorption," 2006, Oxford University Press, 2nd Ed., pp. 20-21.
Cerniglia et al., "Inspection of additive-manufactured layered components," Ultrasonics. 2015 62:292-298 (2015).
Cheeke, Fundamentals and Applications of Ultrasonic Waves, Chapters 8 and 10, CRC Press LLC, Boca Raton, Florida, 54 pages (2002).
Christman, D. R., et al. "Measurements of dynamic properties of materials vol. III: 6061-T6 aluminum." DNA Report, DASA 2501-3, AD735966 (1971).
Chryssolouris, G. (1994). Sensors in laser machining. CIRP Annals—Manufacturing Technology, 43(2), 513-519.
Clark, J. "Intermolecular Bonding—Van der Waals Forces," Sep. 2012, Retrieved from the Internet: URL: http:www.chemguide.co.uk/atoms/bonding/vdw.html, retrieved on Jul. 28, 2015, pp. 1-8.
Cosenza et al., "Generation of Narrowband Antisymmetric Lamb Waves Using a Formed Laser Source in the Ablative Regime," IEEE Trans. Ultrason. Ferroelectr. Freq. Control 54(1):147-156 (2007).
Daintith, J. et al., "Dictionary of Science—Hydrogen Bond," 2010, Oxford University Press, 6th Ed., pp. 404-405.
Dewhurst et al., "Optical emote measurement of ultrasound," Meas. Sci. Technol. 10:R139-R168 (1999).
Doubenskaia et al., "Comprehensive Optical Monitoring of Selective Laser Melting," JLMN 7(3):236-243 (2012).
Elhadj, S. Matthews, M J, & Yang, S T. (2012). Combined infrared thermal imaging and laser heating for the study of materials thermophysical and processing properties at high temperatures. Critical Reviews in Solid State and Material Sciences, vol. 39, No. 3. Mar. 28, 2014, pp. 175-196. Retrieved from http://www.osti.gov/scitech/servlets/purl/1132002.
Frazier, "Metal Additive Manufacturing: A Review," JMEPEG 23:1917-1928 (2014).
Greer et al., "Nanoscale gold pillars strengthened through dislocation starvation," Phys. Rev. B 73:245410-1 through 245410-6 (2006).
Gu et al., "Laser additive manufacturing of metallic components: materials, processes and mechanisms," International Materials Reviews 57(3):133-164 (2012).

(56) References Cited

OTHER PUBLICATIONS

Hariharan, Handbook of Optics vol. II (Michael Bass et al., Eds.; McGraw-Hill, Inc., New York), Chapter 21 Interferometers, Division of Applied Physics, CSIRO, Sydney, Australia. pp. 21.1-21.28 (1995).
Hazan et al., "Effective Prevention of Microbial Biofilm Formation on Medical Devices by Low-Energy Surface Acoustic Waves," Antimicrob. Agents Chemother. 50(12):4144-4152 (2006).
Herderick, "Progress in Additive Manufacturing," JOM 67(3):580-581 (2015).
Hess, "Surface Acoustic Waves in Materials Science," Phys. Today 42-47 (2002).
Hubert et al., "Contactless ultrasonic device to measure surface acoustic wave velocities versus temperature," Rev. Sci. Instrum. 78:024901 (2007).
Hurley et al., "Surface Acoustic Wave Methods to Determine the Anisotropic Elastic Properties of Thin Films," Meas. Sci. Technol. 12:1486-1494 (2001).
Kaplan, S.M., "Electrical and Electronics Engineering Dictionary," pp. 81-82 (2004).
Kenderian et al., "Narrow band laser-generated surface acoustic waves using a formed source in the ablative regime," J. Acoust. Soc. Am. 113(1):261-266 (2003).
Kino, Gordon S. Acoustic waves: devices, imaging, and analog signal processing. vol. 107. Englewood Cliffs, NJ: Prentice-Hall, 1987.
Koyama et al., "Noncontact ultrasonic transportation of small objects in a circular trajectory in air by flexural vibrations of a circular disc," IEEE Trans. Ultrason. Ferroelectr. Freq. Control. 57(6):1434-1442 (2010).
Kruth et al., "Selective laser melting of iron-based powder," J. Mat. Proc. Tech. 149:616-622 (2004).
Leong et al., "Ultrasonic Separation of Particulate Fluids in Small and Large Scale Systems: A Review," Ind. Eng. Chem. Res. 52:16555-16576 (2013).
Ma et al., "Fast diffusion of water nanodroplets on graphene," Nat. Mater. 15(1):66-71 (2016) (Epub Oct. 19, 2015).
Manzo et al., "Application of a laser heterodyne technique to characterize surface acoustic waves generated via a pulsed laser excitation," Proc. of SPIE vol. 8967 (7 pages) 2014.
Manzo et al., "Demonstration of enhanced surface mobility of adsorbate cluster species by surface acoustic wave excitation induced by a pulsed laser," Proc. of SPIE vol. 8969 (8 pages) 2014.
Mavrikakis et al., "Effect of Strain on the Reactivity of Metal Surfaces," Phys. Rev. Lett. 81(13)2819-2822 (1998).
McKeen, L.W., "Effect of Temperature and Other Factors on Plastics and Elastomers," 2008, William Andrew Publishing/Plastics Design Library, 2nd Ed., pp. 1.
Mireles et al., "Closed-loop automatic feedback control in electron beam melting," Int. J. Adv. Manuf. Technol. 78:1193-1199 (2015).
Monchalin, "Optical Detection of Ultrasound," IEEE T. Ultrason. Ferr. UFFC-33(5):485-499 (1986).
Nadal et al., "Continuous model for the shear modulus as a function of pressure and temperature up to the melting point: Analysis and ultrasonic validation," J. Appl. Phys. 93(5):2472-2480 (2003).
Ni et al., "Effect of Pretreatment on PET Films and its Application for Flexible Amorphous Silicon Solar Cells," IEEE pp. 000293-000296 (2009).
Ogi et al, "Ultrasonic attenuation and grain-size evaluation using electromagnetic acoustic resonance," J. Acoust. Soc. Am. 98(1):458-464 (1995).
Pandey et al., "Improvement of surface finish by staircase machining in fused deposition modeling," J. Mater. Process. Technol. 132:323-331 (2003).
Papadakis, "Revised Grain-Scattering Formulas and Tables," J. Acoust. Soc. Am. 37(4):703-710 (1965).
Pedersen et al., "Surface Plasmon Resonance Spectroscopy of Gold Nanoparticle-Coated Substrates," Defence R&D Canada-Suffield, Technical Report (2005).
Pettenkofer et al., "Morphology of the Si/Zno Interface," FVS Workshop pp. 22-29 (2002).
Popa et al., "Active acoustic metamaterials reconfigurable in real time," Phys. Rev. B 91:220303-1 through 220303-5 (2015).
Pyka et al., "Surface Roughness and Morphology Customization of Additive Manufactured Open Porous Ti6A14V Structures," Materials 6:4737-4757 (2013).
Ruffino et al., "Self-organization of gold nanoclusters on hexagonal SiC and SiO2 surfaces," J. Appl. Phys. 101:064306-1 through 064306-7 (2007).
Sajeesh et al., "Particle separation and sorting in microfluidic devices: a review," Microfluid Nanofluid 17:1-52 (2014).
Scruby et al., "The Launching of Rayleigh Waves from Surface Point Sources," Rayleigh-Wave Theory and Application pp. 102-109 (1985).
United States Patent and Trademark Office Final Office Action for U.S. Appl. No. 15/053,878, dated Jul. 27, 2017 (10 pages).
United States Patent and Trademark Office Non-Final Office Action for U.S. Appl. No. 15/053,878, dated Jan. 23, 2017 (11 pages).

\* cited by examiner

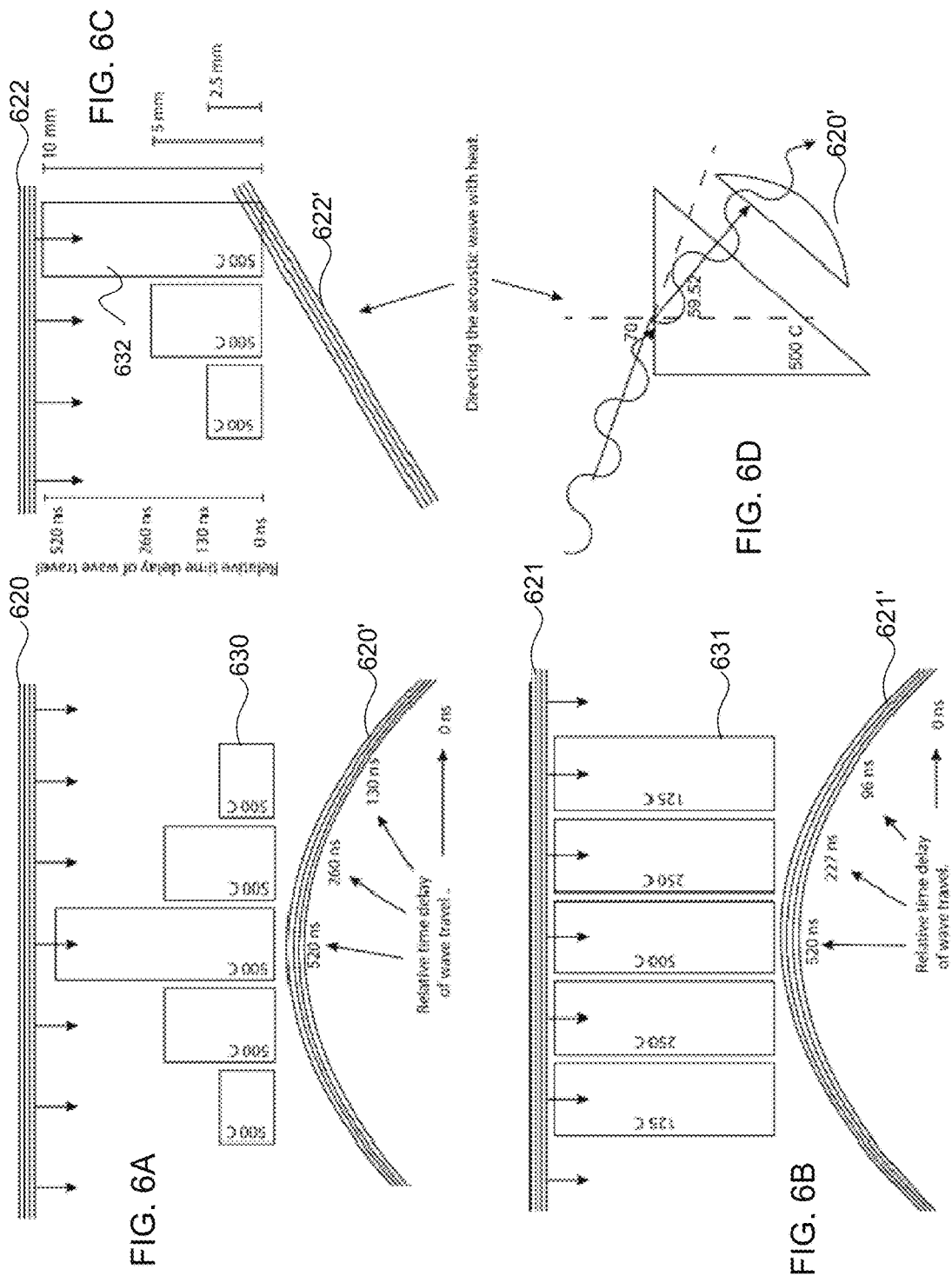

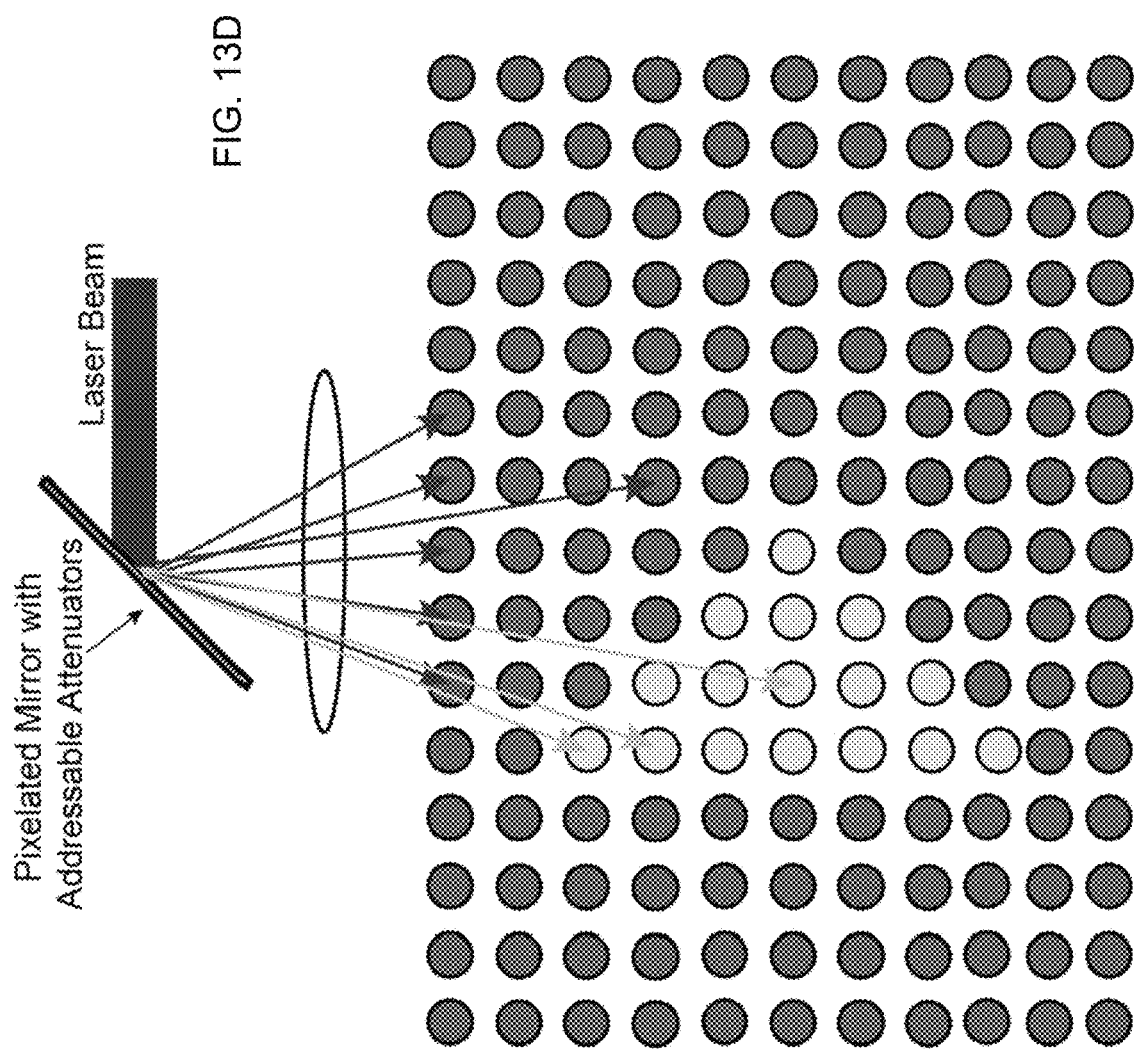

SYSTEMS AND METHODS FOR MODIFYING ACOUSTIC WAVES BASED ON SELECTIVE HEATING

STATEMENT OF GOVERNMENT INTEREST

The current subject matter was made with government support under Contract FA8802-14-C-0001 awarded by the Department of the Defense through the Air Force. The government has certain rights in this subject matter.

FIELD

This application relates to the effect of localized and time dependent heating on acoustic waves in or on materials.

BACKGROUND

Acoustic waves, and at higher frequencies ultrasonic waves, can propagate along the surface of a material or in the bulk of a material, or a combination of the two. For example, acoustic waves that propagate along the surface of a material can be referred to as surface acoustic waves (SAWs) or surface ultrasonic waves (SUWs), and can have a bulk component. Acoustic waves, such as SAWs, have been used in a variety of commercial applications. For example, acoustic waves have been used for non-destructive evaluation (NDE) of bulk materials, single layer or multilayer films, and laminates. As another example, devices based on SAWs of sufficiently high frequency (e.g., 1 MHz or greater) can be used in radar and mm-wave signal processing As another example, chip scale devices are commercially available that do signal processing based on SAW technology. As yet another example, SAWs have been used in ultrasonic microscopy. In these and other practical applications, it can be useful to maintain constant propagation characteristics of the acoustic waves, e.g., based on proper choice of material or tuning the material properties so as to facilitate calibration. For example, acoustic waves obey the wave equation much like visible light. As such, minute changes in the local density of the material (e.g. index of the material for light waves) in which the acoustic wave is propagating can have an effect on one or both of the wave's phase front and the wave's Poynting vector (i.e. direction of propagation).

SUMMARY

The current subject matter provides for modifying acoustic waves based on time resolved and sight specific pulsed selective heating to, in most applications, temporarily alter the local material density or if molecular adsorbates are present on a surface, the surface concentration. A temporary alteration makes the current subject matter "reprogrammable".

In a first aspect, an acoustic wave is modified by initiating excitation of an acoustic wave from a first location on a substrate to a second location on the substrate and selectively heating the second location of the substrate so as to alter a property of the second location. With such arrangements, the altered property of the second location modifies the acoustic wave to result in a modified acoustic wave that is propagated from the second location to a third location on the substrate.

In an interrelated aspect, a system for modifying an acoustic wave can include a heater thermally coupled to a substrate that has a first location and a second location, and a controller coupled to the heater. The controller can be configured so as to control the heater so as to initiate excitation of an acoustic wave from a first location on a substrate to a second location on the substrate and to selectively heat the second location of the substrate so as to alter a property of the second location. With such arrangements, the altered property of the second location modifies the acoustic wave to result in a modified acoustic wave that is propagated from the second location to a third location on the substrate. The acoustic wave can include a surface acoustic wave and/or a bulk acoustic wave.

The selective heating can be initiated subsequent to the initiation of excitation of the acoustic wave and subsequent to the acoustic wave propagating to the second location on the substrate.

In some implementations, the third location of the substrate can be selectively heated so as to alter a property of the third location which, in turn, further modifies the acoustic wave to result in a further modified acoustic wave that is propagated from the third location to a fourth location on the substrate.

The altered property of the second location can be a thermal property, a mechanical property, and/or a chemical property. In addition or the alternative, the altered property of the second location can focus or defocus the acoustic wave at the third location. Further, the altered property of the second location can redirect a path of the acoustic wave toward the third location. The altered property of the second location can shift a phase of the acoustic wave.

The first location of the substrate can include first interdigitated electrodes configured to initiate excitation of the acoustic wave responsive to a first voltage applied across the first interdigitated electrodes. The third location of the substrate can include a second set of interdigitated electrodes configured to generate a second voltage across the second set of interdigitated electrodes responsive to receipt of the modified acoustic wave.

Selectively heating the second location of the substrate can include selectively irradiating the second location with one or more of a pulsed laser or an electron beam. The selectively heating can be effected by actuating a resistive heater in contact with the second location of the substrate and/or by initiating a chemical reaction that produces heat at the second location of the substrate.

The modified acoustic wave can be sensed at the third location. The sensing can be accomplished, for example, by irradiating the third location with a laser beam.

The first location can be disposed at a first material of the substrate. The second location can be disposed at a second material of the substrate. The third location can be disposed at a third material of the substrate. The second material can include a different material than the first material and the third material.

At least one of the first location, the second location, and the third location can be embedded within the substrate.

The acoustic wave can either be a single wavelength wave or a wave packet.

The details of one or more variations of the subject matter described herein are set forth in the accompanying drawings and the description below. Other features and advantages of the subject matter described herein will be apparent from the description and drawings, and from the claims.

BRIEF DESCRIPTION OF DRAWINGS

FIGS. 6A-6D schematically illustrate exemplary modifications to acoustic waves based on selective heating over various regions of spatial extent or different temperature or incidence angle of the acoustic waves.

FIGS. 13A-D schematically illustrates selected components of an exemplary system for modifying acoustic waves so as to generate a phononic structure based on selective heating.

DETAILED DESCRIPTION

The current subject matter provides systems and methods for modifying acoustic waves based on time and spatial resolved pulsed heating.

For example, the current subject matter is based on the recognition that propagating an acoustic wave through a selectively heated region of a material can alter one or more properties of the acoustic wave. The alteration to the propertie(s) of the acoustic wave can be based on one or more of the thermal and elastic properties of the material, the temporal and spatial characteristics of the selectively heated region of the material, and the frequency and spatial characteristics of the acoustic wave. For example, the selective heating of the region of material can alter a thermal, mechanical, or chemical property of that region of the material, which upon interaction with acoustic wave modifies the acoustic wave as it propagates through. Illustratively, the altered property of that region of the material can for example cause the extended (i.e. not the ray) acoustic wave to focus or defocus, to be redirected, to be phase shifted, or otherwise suitably modified in a manner similar to an optical component's manipulation of light.

Figure 1A:
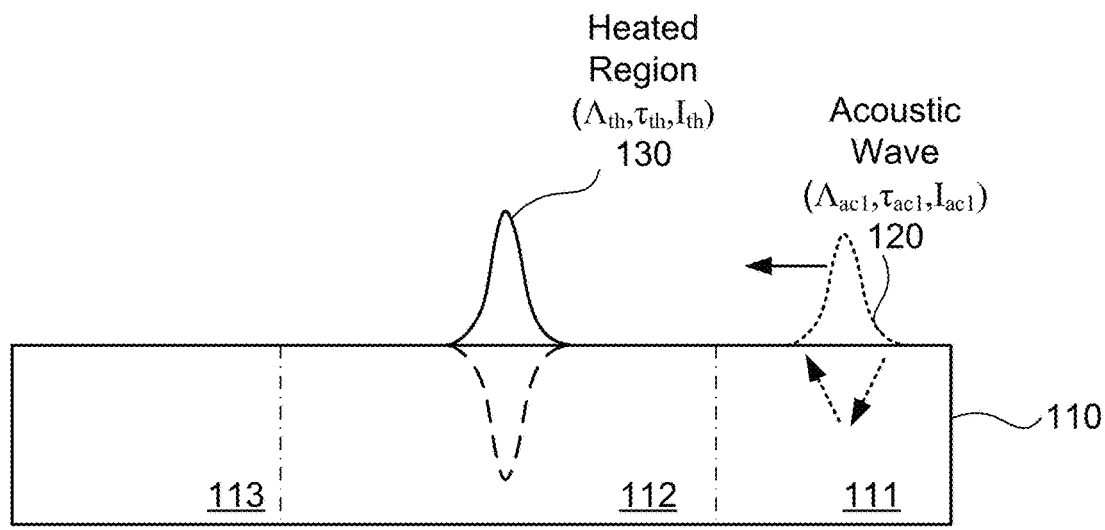
FIGS. 1A-1C schematically illustrate steps during an exemplary method for modifying an acoustic wave based on selective heating.
Figure 1B:
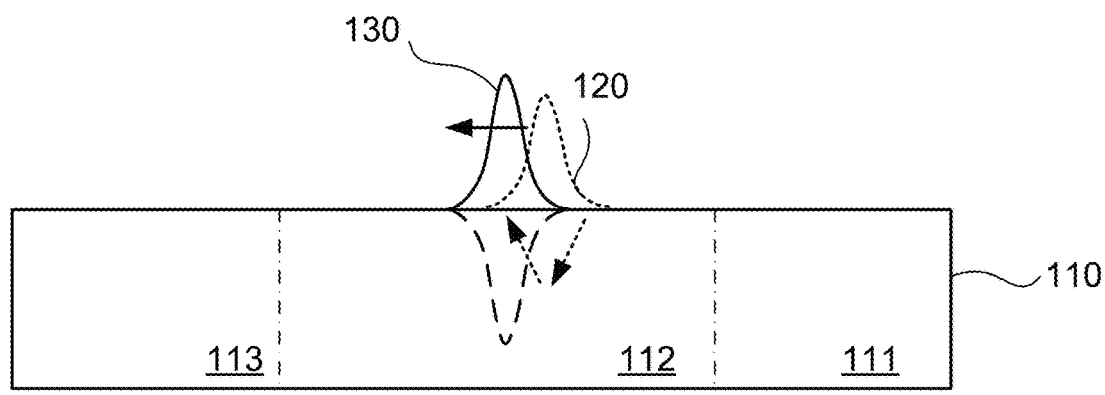
Figure 1C:
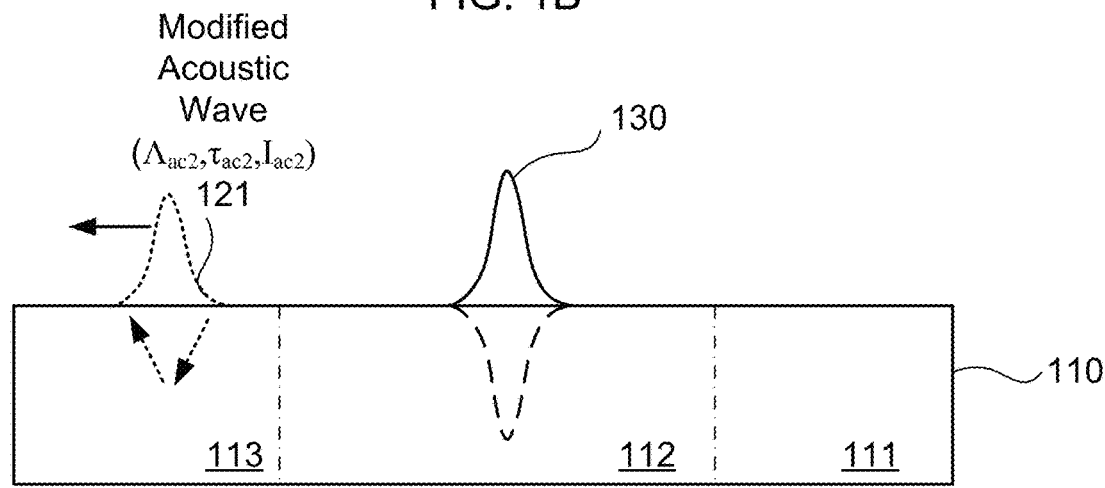

FIGS. 1A-1C schematically illustrate steps during an exemplary method for modifying an acoustic wave based on selective heating. In FIG. 1A, acoustic wave 120 is initiated at a first location 111 of substrate 110. Acoustic wave 120 can include a surface acoustic wave, or a bulk acoustic wave, or at very high frequencies it is given the name, phonon. In amorphous medium phonons tend not to propagate over large distances as compared to crystalline matter. Moreover, 120 can be a guided acoustic wave, or any suitable combination thereof. For example, in FIGS. 1A-1C, the angled arrows within the material of substrate 110 denote that acoustic wave 120 includes components that travel within the material of substrate 110. Acoustic wave 120 can be characterized by a first spatial profile $A_{ac1}$, a first temporal profile $\tau_{ac1}$, and a first intensity profile $I_{ac1}$ based on the particular manner in which acoustic wave 120 is generated. The spatial profile depends on the energy source applied and can be less than a nanometer (e.g. for an e-beam source).

In practice, however, the spatial profile depends on the physical size of the acoustic wave alteration that is desired and must take into consideration the frequency of the acoustic wave and velocity of sound in the material, with the relationship that ($\lambda$=V/v; where $\lambda$ is acoustic wave wavelength (meters), v is the frequency (sec-1) and V is local velocity of sound in the medium (m/sec)). There are some noteworthy differences between the spatial profile $\Lambda$ (which may contain a wave packet of many frequencies) and the wavelength of a particular frequency $\lambda$ (as defined by the equation above). On the short end of the scale, the temporal profile depends on the energy source used to induce the acoustic wave. For example, with a 100 femtosecond laser (temporal pulse width) as the energy source the wave could be 100 femtoseconds. Short temporal wave profiles tend to produce higher frequency waves in comparison to a longer temporal profile and lower frequencies. Acoustic waves from low Hertz to terahertz have been generated. The intensity range of an acoustic wave is limited by the material properties. At too high intensity (energy on material/unit time which results in higher pressure or force on material per unit time) the material fractures (i.e. related to the elastic/mechanical properties of the material). Atomic strains on the order of a few percent (i.e. bond length changes) can induce bond rupture. At the other end of the scale where the intensity is lower but the applied temporal duration is longer, the material is likely to heat up (due to scattering losses of acoustic waves propagating in the medium) and melt.

Note that although acoustic wave 120 is schematically illustrated as being unipolar, it should be understood that acoustic wave 120 can have any suitable spatial, temporal, and intensity profile that are defined by the material's elastic/mechanical and thermal properties. For example, acoustic wave 120 can be unipolar, bipolar, narrowband, or can have a more complex profile. Exemplary methods of generating acoustic waves are described elsewhere herein or otherwise are known in the art. For example, acoustic wave 120 suitably can be generated using one or more laser pulses, e.g., such as described herein with reference to FIGS. 3A-3C, or using interdigitated electrodes, e.g., such as described herein with reference to FIGS. 2A-2B, or via pulsed electron beam as generically shown in FIG. 4

Second location 112 of substrate 110 selectively is heated (e.g., substantially without heating first location 111 or third location 113 of substrate 110) so as to alter a property of the second location. Illustratively, the altered property of second location 112 can be selected from the group consisting of a thermal property, a mechanical property, and a chemical property. For example, thermal properties include the temperature, heat conductivity, thermal diffusivity, specific heat and or heat capacity. Examples of these parameters are given below.

Example Properties for Cu and Al:
K=1.11e-4; % thermal diffusion of Cu @25 C in m^2/s units
$R_s$=0.0005; % radius of laser beam energy in meters
$K_t$=401; % thermal conductivity of Cu in W/(m*K)
A=0.3; % Absorption of energy in Cu (visible wavelengths)
K=8.418e-5; % thermal diffusion of Al in m^2/s units
$R_s$=0.01; % radius of laser beam energy in meters
$K_t$=220; % thermal conductivity of Al (approx.) in W/(m*K)
A=11e-3; % Absorption of energy in Al (9.6 microns)

These parameters in turn can affect mechanical properties such as the density, elastic constants, strain, stress, etc. Chemical changes can include changes in the surface due to temperature catalyzed reactions, or modifications of the bulk solid after cycling through one or more liquification (melting) and solidification phases. The thermophysical and optical properties of the material can also change, though for most metals the change from room temperature to melting point for properties such as thermal conductivity, thermal diffusivity, and heat capacity do not exceed 10%. The metal absorptivity can have a large variation within these temperature regimes. It is also conceivable that a brief chemical event, in the material or on the surface, could produce sufficient heat as to locally alter the material properties. The chemical event generates heat that is transferred to the material raising the temperature, T. The heat flow follows the heat conduction equation (equation shown with no convection term).

$$\rho c \frac{\partial T}{\partial t} = k_T \nabla^2 T + A_V I(x, y, z, t)$$

EQ1 describes the change in temperature, T for an applied heat source intensity (e.g. applied via a laser, chemical event, or ebeam) I at a particular location (x, y, z) as a function of time, t. In the equation, $\rho$ is the density, c is the specific heat, $k_T$ is the heat conductivity of the metal, and $A_V$ is the fraction of radiation energy absorbed (per unit time and unit volume).

Second location 112 can include heated region 130 characterized by a spatial profile $\Lambda$th, a temporal profile $\tau$th, and an intensity profile Ith based on the particular manner in which heated region 130 is generated, and one or more properties of second location 112 can be altered within heated region 130. In an example where substrate 110 is a thermally thin and thermally insulated metal foil and heat is applied via a chemical event (either via a reaction of an incident energy source like a pulsed laser or e-beam with a reactive substrate, or a reactive substrate with a thin adlayer which is triggered by an incident energy source like a pulsed laser or e-beam) the thermal conductivity equation can be replaced by an energy conservation equation as shown in Equation 2. The equation describes the change of temperature as a function of time but for a chemical event heating source (and for a thin insulated sample).

$$cm \frac{dT}{dt} = AP - Q \quad \text{[EQ2]}$$

where c is the specific heat, m is the mass, A is the absorptivity, P is the average radiation power, and Q is the power of the thermal losses.

Taking into account the exothermal character of the chemical reaction, the value of A has to be substituted with the so-called effective target absorptivity $$A_e \rightarrow A + P_{ex}/P$$

And the power released in the chemical reaction is then described by the equation $$P_{ex} = \rho S W_H \frac{dx}{dt}$$

with $\rho$ being the density of the oxide, $W_H$ the latent heat of the reaction, and S the total area where the chemical reaction takes place.

Figure 4:
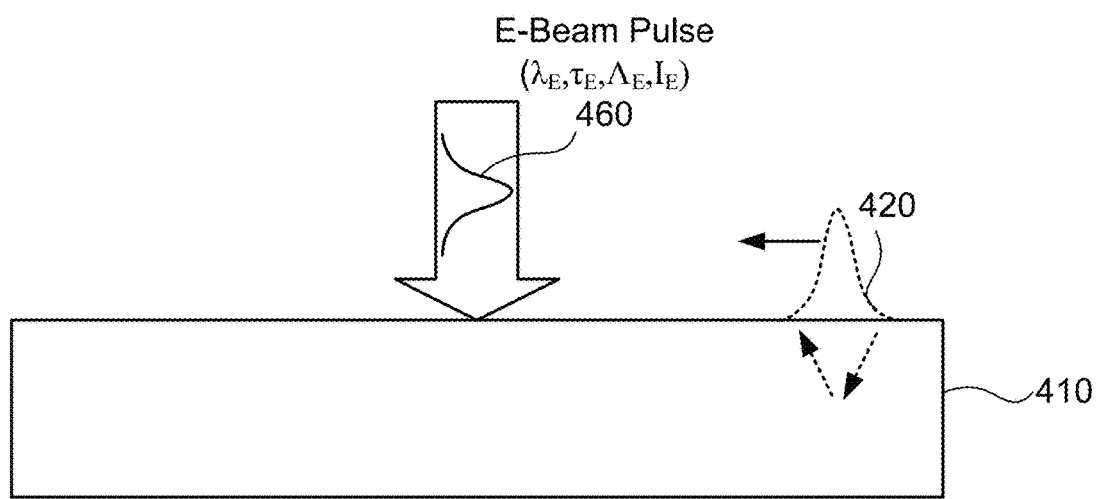
FIG. 4 schematically illustrates steps during yet another exemplary method for modifying an acoustic wave based on selective heating.
Figure 5A:
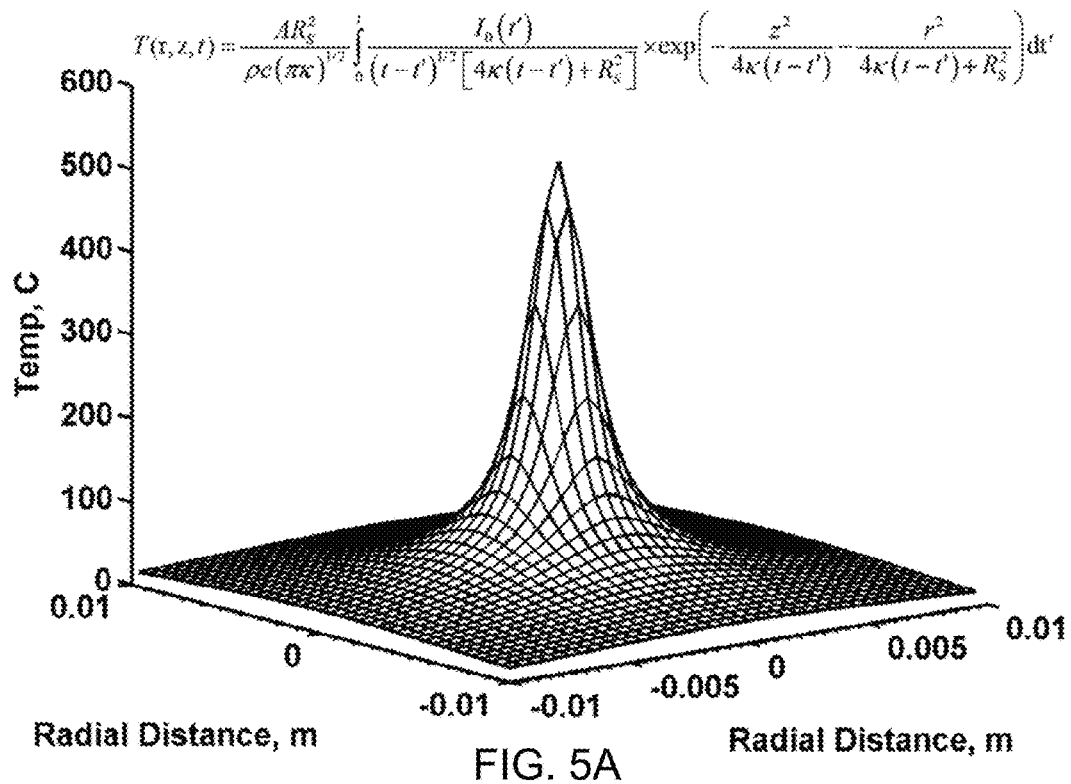
FIG. 5A illustrates a plot of the simulated temperature profile of an exemplary heated region of a material as a function of radial distance.
Figure 5B:
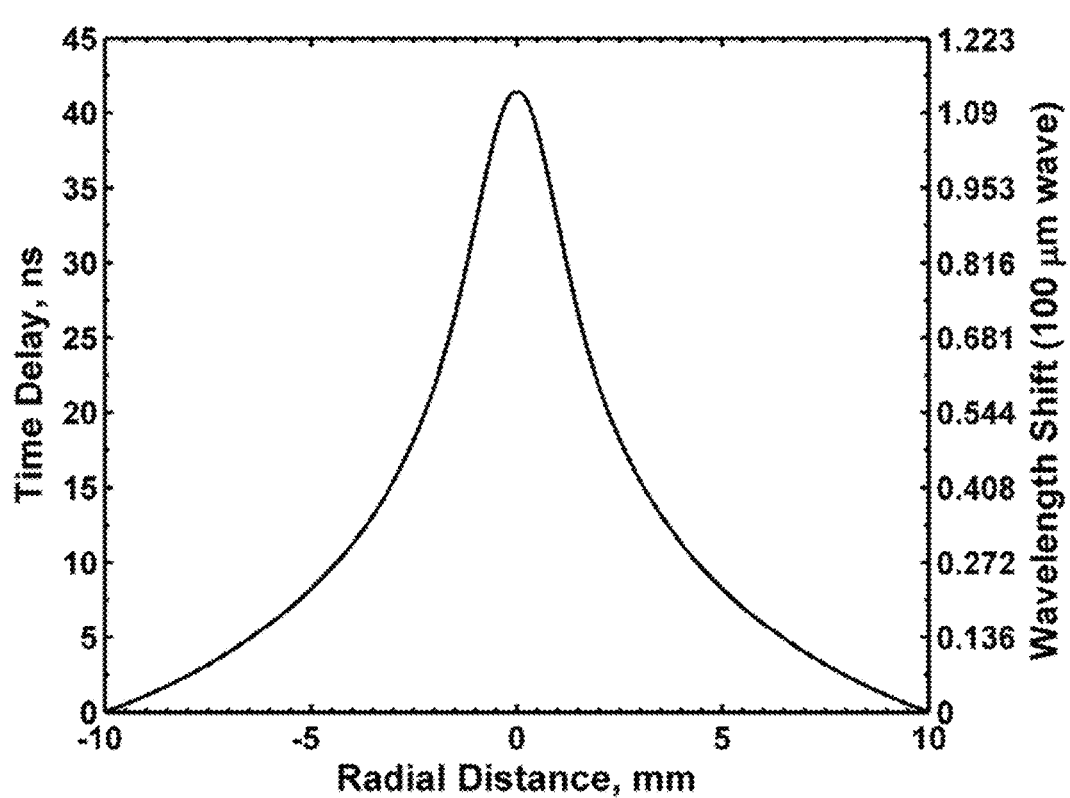
FIG. 5B illustrates a plot of exemplary changes in the phase of a simulated acoustic wave propagating through the heated region of FIG. 5A as a function of radial distance.
Figure 5C:
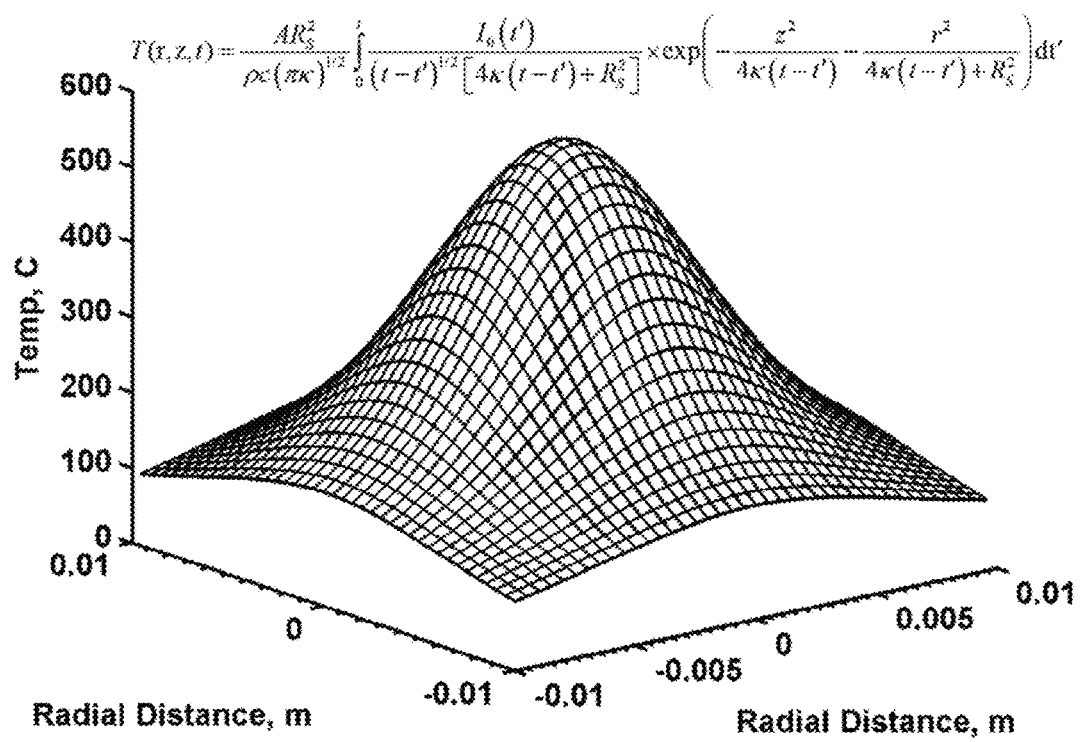
FIG. 5C illustrates a plot of the simulated temperature profile of another exemplary heated region of a material as a function of radial distance.
Figure 5D:
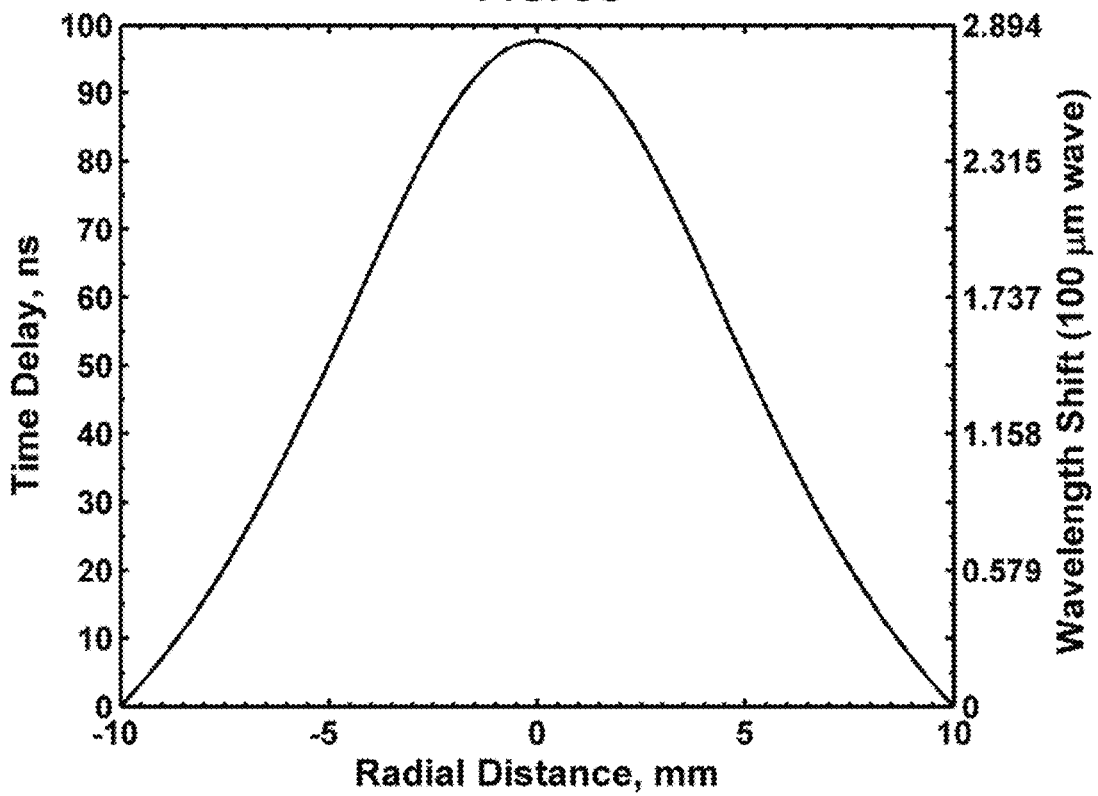
FIG. 5D illustrates a plot of exemplary changes in the phase of a simulated acoustic wave propagating through the heated region of FIG. 5C as a function of radial distance.
Figure 13A:
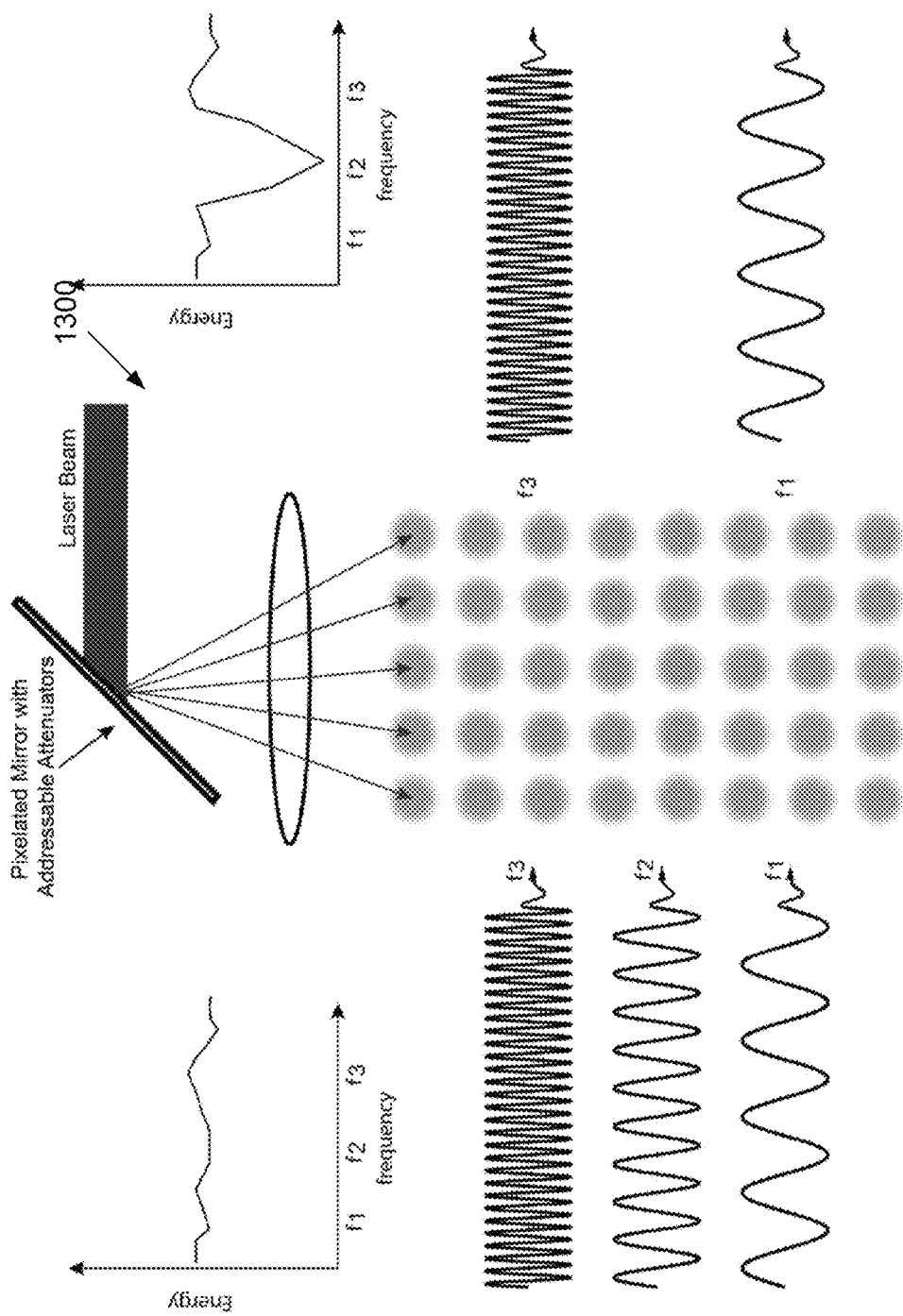

Exemplary methods of heating a region of a substrate are described elsewhere herein or otherwise are known in the art. For example, region 112 suitably can be selectively heated using one or more laser pulses, e.g., such as described herein with reference to FIGS. 3A-3C, or using one or more electron beam pulses, e.g., such as described herein with reference to FIG. 4, or by actuating a resistive heater in contact with second location 112 of substrate 110 in a manner such as described herein with reference to FIGS. 10A-10B, or for some embodiments one or more localized chemical "explosion" events, that generate produce a heat flux necessary to heat the material Acoustic wave 120 is transmitted (i.e., propagated) from first location 111 of substrate 110 to second location 112 of substrate 110. For example, as illustrated in FIG. 1B, acoustic wave 120 propagates to and interacts with heated region 130 within second location 112. The altered property of second location 112 modifies acoustic wave 120, generating modified acoustic wave 121 illustrated in FIG. 1C (in location 113). For example, the altered property of heated region 130 within second location 112 can focus or defocus acoustic wave 120 at a point distal of heated region 130, e.g., within third location 113 of the substrate. As another example, the altered property of heated region 130 within second location 112 can redirect a path of acoustic wave 120 toward third location 113 or a specific region therein. As another example, the altered property of heated region 130 within second location 112 can shift a phase of acoustic wave 120. As such, the altered property of second location 112 can modify one or more of $\Lambda_{ac1}$, $\tau_{ac1}$, and $I_{ac1}$, resulting in modified acoustic wave 121 characterized by a second spatial profile $\Lambda_{ac2}$, a second temporal profile $\tau_{ac2}$, and a second intensity profile $I_{ac2}$. Ranges for each of these parameters depend on the application. For example, the modification could reduce all the parameters to zero (an absorber) and depending on how the velocity of sound in the material changes with temperature the modifications can be any range from a few % to 100% change or it remove a particular frequency (a filter) and reduce the parameters to zero as shown in FIG. 13A. For example, the right axis of FIG. 5B (and FIG. 5D) shows the possible change for a wavelength of 100 µm. The figure/s show that it is possible to induce a modification that produces a delay (arrival time) or spatial shift of at least 1 full wave (FIG. 5B) and over 2.9 waves (FIG. 5D). A shift of the length of a single wave is all that is required to redirect a sinusoidal wave. Note that the second spatial profile can be different from the first spatial profile, the second temporal profile can be different from the first temporal profile, or the second intensity profile can be different from the first intensity profile, or any suitable combination thereof. Given the thermal properties of the material (i.e. heat capacity and conductivity) it is even conceivable that different heat patterns (spatial extents) can be placed on all the regions and altered on a time scale that depends on the heat capacity, conductivity and the amount of material present (i.e. heat sink). As illustrated in FIG. 1C, modified acoustic wave 121 is transmitted from second location 112 to third location 113 of the substrate. Optionally, modified acoustic wave 121 can be detected using any suitable device or method, e.g., interdigitated electrodes such as described herein with reference to FIGS. 2A-2B, or a laser beam, e.g., laser pulse such as described herein with reference to FIGS. 3A-3C where the third laser 353 (pulsed or CW) is a sensor such as a heterodyne displacement sensor.

Note that substrate 110 can include any suitable material or combination of materials, and that the first, second, and third locations 111, 112, 113 of substrate 110 can be, but need not necessarily be, the same as one another. For example, first location 111 can be disposed at a first material of substrate 110, second location 112 can be disposed at a second material of substrate 110, and third location 113 can be disposed at a third material of substrate 110. Optionally, the second material can include a different material than does the first material and the third material. Exemplary materials that are suitable for use in substrate 110, e.g., one or more of first, second, and third locations 111, 112, 113 thereof, can include one or more of the following, or any suitable combination thereof: a piezoelectric material, (e.g. quartz, lithium niobate, etc.), metals (e.g. copper, aluminum, etc.), semiconductor (e.g. silicon, GaAs, etc.), ceramics (e.g. ALON, etc.), polymers, composite materials (e.g. MnV2O4, La1.98, Nd0.02Cu4, etc.), graphite, and phononic crystals.

Additionally, note that first location 111, second location 112, and third location 113 independently can be located at any suitable position within substrate 110. For example, at least one of first location 111, second location 112, and third location 113 optionally can be embedded within substrate 110. The current subject matter can require that the local temperature be raised sufficiently to affect acoustic wave property. If this can be called "programming" the acoustic material alteration, it is not possible to reprogram the material alteration until the local heated region has dissipated. Consequently, if property changes were only used on a surface, it would limit program-processing speed. However, as for example with pulsed lasers and an appropriate material (e.g. that is transparent) it is possible to embed (in the material) a localized heated zone and therefore affect bulk acoustic waves and thereby enhance the speed at which material property changes can be reprogrammed.

Figure 2A:
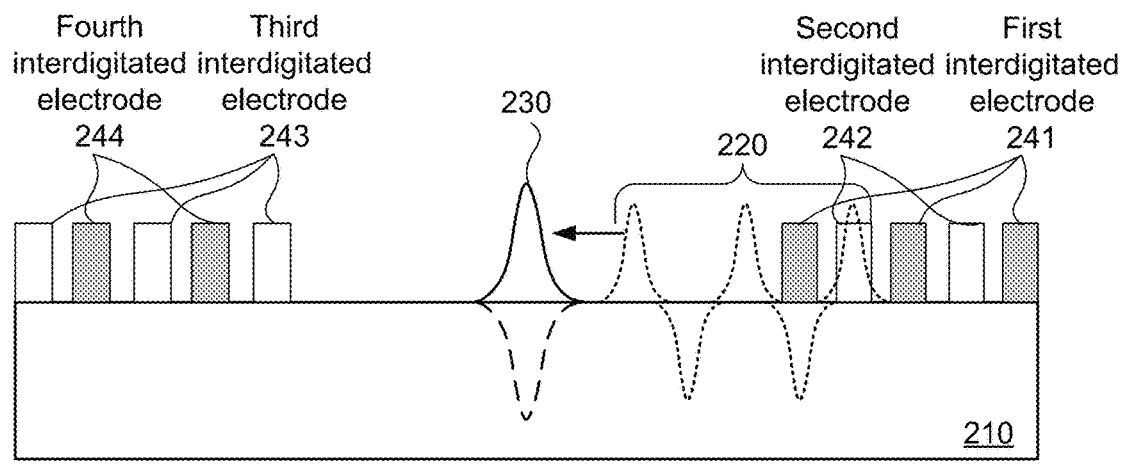
FIGS. 2A-2B schematically illustrate steps during another exemplary method for modifying an acoustic wave based on selective heating.
Figure 2B:
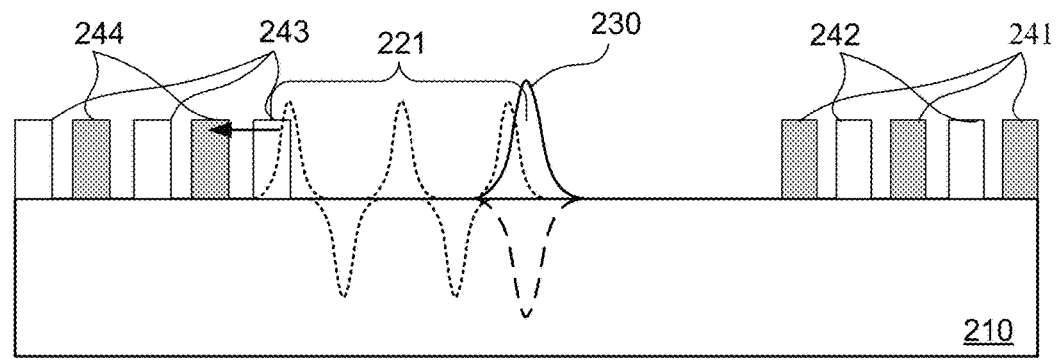

Note that acoustic wave 120 described herein with reference to FIGS. 1A-1C can be generated using any suitable method or device. For example, FIGS. 2A-2B schematically illustrate steps during another exemplary method for modifying an acoustic wave based on selective heating. In FIGS. 2A-2B, acoustic wave 220 suitably can be generated using a series of interleaved electrodes provided by a patterned metal film disposed on a piezoelectric substrate. For example, as illustrated in FIG. 2A, the first location of piezoelectric substrate 210 includes first and second interdigitated electrodes 241, 242 configured to initiate acoustic wave 220 responsive to a first voltage applied across the first and second interdigitated electrodes. Note that acoustic wave 220 can have a similar spatial profile as do interdigitated electrodes 241, 242. First and second interdigitated electrodes 241, 241 can be spaced apart from another set of interdigitated electrodes that can serve as a sensor. For example, the third location of substrate 210 can include third and fourth interdigitated electrodes 243, 244. The digital electrodes need not be placed on the surface, a second surface which includes the electrodes can be placed in contact with the first surface allowing the acoustic waves to couple (at some loss of intensity) to the first surface.

Acoustic wave 220 can propagate through selectively heated second region 230 of substrate 210, which region modifies one or more properties of the acoustic wave, resulting in modified acoustic wave 221. As illustrated in FIG. 2B, third and fourth interdigitated electrodes 243, 244 can be configured to generate a second voltage across the third and fourth interdigitated electrodes responsive to receipt of modified acoustic wave 221. Modification of acoustic wave 220 by heated region 230 can result in detectable changes to temporal or intensity characteristics of the second voltage generated across third and fourth interdigitated electrodes 243, 244. As such, referring again to FIGS. 1A-1C, modified acoustic wave 121 optionally can be detected using interdigitated electrodes such as third and fourth interdigitated electrodes 243, 244. Note that in embodiments in which interdigitated electrodes are used to detect the modified acoustic wave, interdigitated electrodes need not necessarily be used to generate the acoustic wave prior to modification. Conversely, in embodiments in which interdigitated electrodes are used to generate the acoustic wave prior to modification, interdigitated electrodes need not necessarily be used to detect the modified acoustic wave; instead, the modified acoustic wave optionally can be detected using any suitable device or method.

Figure 3A:
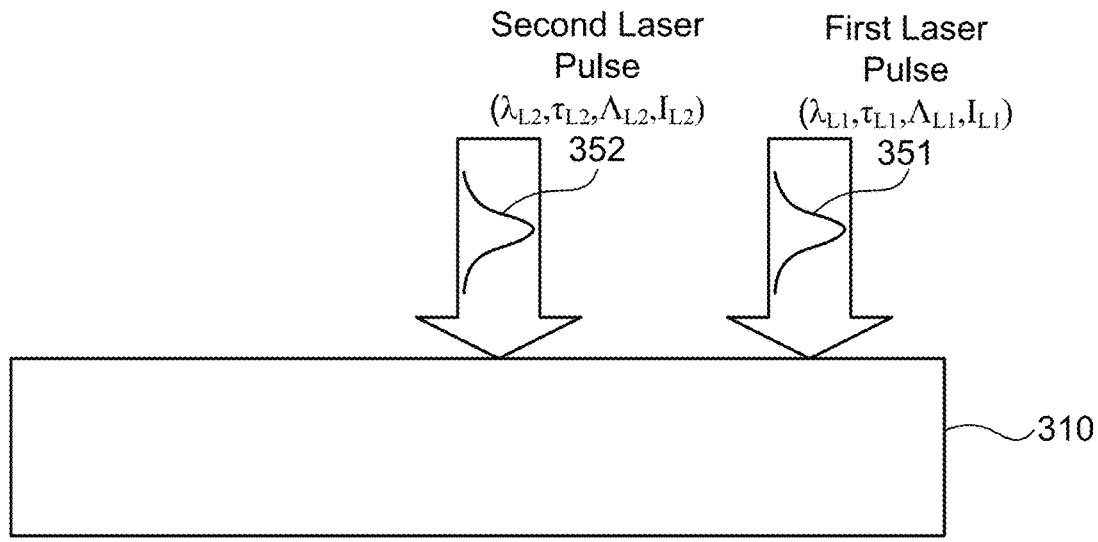
FIGS. 3A-3C schematically illustrate steps during another exemplary method for modifying an acoustic wave based on selective heating.
Figure 3B:
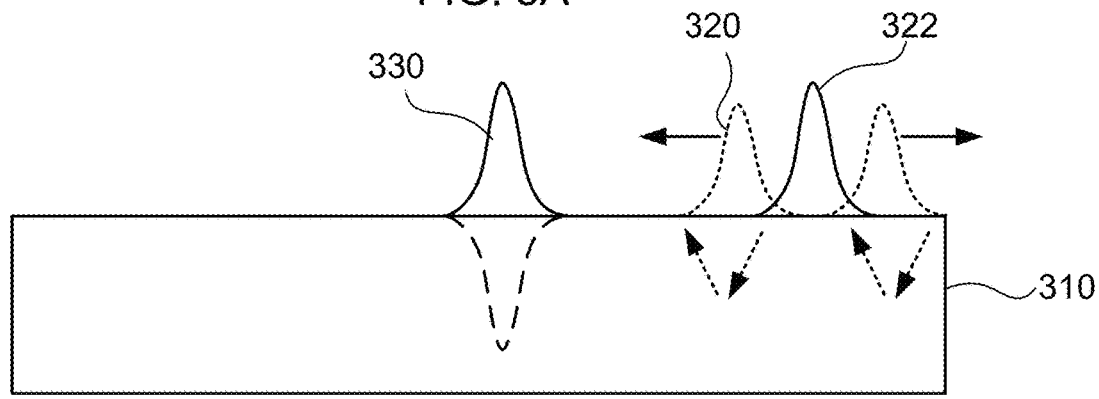
Figure 3C:
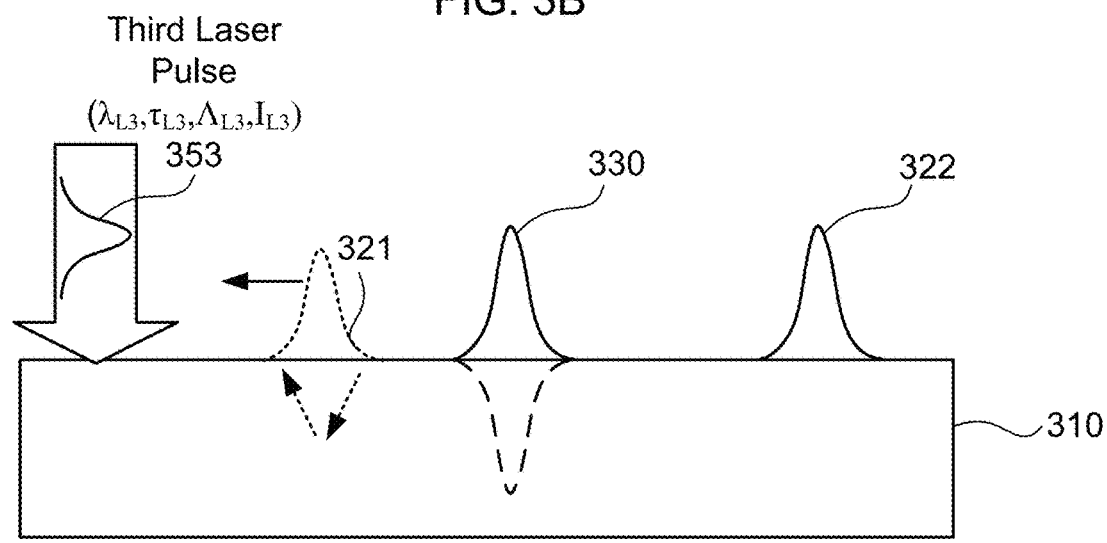

Alternatively, acoustic wave 120 illustrated in FIGS. 1A-1C can be generated using one or more laser pulses. For example, FIGS. 3A-3C schematically illustrate steps during another exemplary method for modifying an acoustic wave based on selective heating. In FIG. 3A, a first location of substrate 310 is irradiated with one or more first laser pulses 351 having first laser wavelength $\lambda_1$, first laser temporal profile $\tau_{L1}$, first laser spatial profile $\Lambda_{L1}$, and first intensity profile $I_{L1}$. The parameter ranges have been described above as for FIG. 2, however in the case of embodiment shown in FIG. 3, there is a possible additional constraint if the device/application is to be less complicated, which is that the heat load of each laser must not be allowed to spatially expand to affect the area where a second laser is active. However, it is possible that the two heat sources can spatially expand and overlap however this overlapped heated portion is then controlled. Consequently, there is a maximum time defined by the material's thermal properties of the material (e.g. heat capacity and thermal conductivity)). As an example, it is described how far apart two laser heat sources must be in distance, given a prescribed desire that at the halfway point between the two heat sources the temperature from each source only be 10% of the peak temperature. For a Cu substrate 110 with the following know thermal parameters:

K=1.11e-4; Thermal diffusion of Cu @25 C in m^2/s units
$K_f$=401; Thermal conductivity of Cu in W/(m*K)
A=0.3; Absorption of energy in Cu
I=108.56/(Rs^2)*pi; Estimate of intensity using W/(m^2)=J/(s*m^2)
$R_s$=0.0001; Radius of laser beam energy in meters
p=8960; Cu density Kg/m^3;
sh=385; Cu specific heat J/(kg*C)

A laser pulse of 10 microsecond duration will create a heat zone that has expanded out to approximately 0.2 mm from the center. A center temperature of 565.5 C will be attained.

10% of this value is 56.5 C which is the temperature at 0.155 mm away from the center. To avoid excess heating from secondary lasers operating with the same parameters, the laser interaction sites should be kept 2*0.155 mm away, or 310 microns apart. This type of calculation is necessary as it gives the user a guide as to how many laser sources can be applied for a given unit area to "program" the surface or bulk for modifying acoustic waves. Additionally, in FIG. 3A, a second location of substrate 310 that is spaced apart from the first location is irradiated with one or more second laser pulses 352 having second laser wavelength $\lambda_{L2}$, second laser temporal profile $\tau_{L2}$, second laser spatial profile $\Lambda_{L2}$, and second intensity profile $I_{L2}$. For the example given above for copper where the heat source is ON for 10 microsecond, it would take ~300 microseconds to cool the peak temperature to room temperature given a thick substrate (e.g. >1 mm thick). The calculation shows the time delay necessary before "reprogramming" of the surface is possible. Equation 3 describes the change in temperature at a given location after the heat source has turned OFF. After the pulse ceases at $t > \tau_p$ the temperature proceeds according to the function:

$$T(z, t > \tau_p) = \frac{2AI_0\kappa^{1/2}}{k_T}\left[t^{1/2}ierfc\left(\frac{z}{2(\kappa t)^{1/2}}\right) - (t - \tau_p)^{1/2}ierfc\left(\frac{z}{2[\kappa(t - \tau_p)]^{1/2}}\right)\right] \quad [EQ3]$$

Note that substrate 310 can be, but need not necessarily be, irradiated with first laser pulse(s) 351 at the same time that substrate 310 is irradiated with second laser pulse(s) 352. For example, substrate 310 can be irradiated with first laser pulse(s) 351 before or after substrate 310 is irradiated with second laser pulse(s) 352.

As illustrated in FIGS. 3A-C, first laser pulse(s) 351 can cause rapid heating of substrate 310 within region 322, which rapid heating causes thermal expansion of substrate 310 within region 322, generating counterpropagating acoustic waves including acoustic wave 320. Additionally, second laser pulse(s) 352 can cause heating of substrate 310 within region 330 towards which acoustic wave 320 propagates and which modifies acoustic wave 320 in a manner such as described elsewhere herein so as to provide modified acoustic wave 321. Additionally, as noted above, modified acoustic wave 321 optionally can be detected at a location of substrate 310 distal to heated region 330. For example, as illustrated in FIG. 3C, a third location of substrate 310 that is spaced apart from the first and second locations is irradiated with a laser beam, e.g., third laser pulse(s) 353 having third laser wavelength $\lambda_{L3}$, third laser temporal profile $\tau_{L3}$, third laser spatial profile $\Lambda_{L3}$, and third intensity profile $I_{L3}$.

The following are sample properties of the third laser pulse which can be used to detect or sense the propagating acoustic wave. 1) The laser wavelength must be chosen to maximize reflection from the surface, so as to enhance sensitivity. 2) The laser can be pulsed or CW, with the CW laser as the more likely to be the more sensitive because of the narrower optical bandwidth. In both cases the reflected light can be captured by a photodetector and analyzed. 3) The laser power (for CW) and intensity (energy/time for pulsed) must be low enough that the irradiation zone is not heated much (e.g. <50 C). 4) The choice of the spatial extent of the laser on the target surface depends on the velocity of sound in the substrate and the desired acoustic wave frequency that needs to be sensed. For a 5 km/s velocity of sound (e.g. glass) and a desired sensing frequency of 100 MHz, the resulting ultrasonic wavelength is 50 microns, consequently the spatial extent of the laser on the target should be at least equal or better much less than 50 microns. Note that the laser beam used to detect modified acoustic wave 321 need not necessarily be pulsed, and instead can be a continuous-wave laser beam, optionally which can be used in a heterodyned detector in a manner analogous to that described in Manzo et al., "Application of a laser heterodyne technique to characterize surface acoustic waves generated by a pulsed laser," Proc. of SPIE 8967: 89670N-1 to 89670N-7 (2014), the entire contents of which are incorporated by reference herein.

Note that in embodiments in which a laser beam, e.g., laser pulse, is used to detect the modified acoustic wave, a laser pulse need not necessarily be used to generate the acoustic wave prior to modification. Conversely, in embodiments in which one or more laser pulses are used to generate the acoustic wave prior to modification, a laser beam, e.g., laser pulse, need not necessarily be used to detect the modified acoustic wave; instead, the modified acoustic wave optionally can be detected using any suitable device or method (e.g. optical interferometry, interdigitated electrodes). Additionally, in embodiments in which one or more laser pulses are used to generate the acoustic wave prior to modification or one or more laser beams, e.g., pulses, are used to detect the modified acoustic wave, a laser pulse need not necessarily be used to selectively heat a location of the substrate through which the acoustic wave passes and that modifies the acoustic wave; instead, the location of the substrate can be selectively heated, resulting in modification of the acoustic wave, using any suitable device or method (e.g. patterned resistive heating, electron beam heating).

Additionally, note that the substrate can include a plurality of first locations, a plurality of second locations, and a plurality of third locations, in sequence or in parallel. For example, acoustic waves can be excited at a plurality of first locations of the substrate, either at the same time as one another or at one or more different times than one another; second locations of the substrate can be heated at the same time as one another or at one or more different times than one another; and the acoustic waves can propagate from the respective first locations, through respective second locations where the waves are modified, and to respective third locations, in parallel or sequentially with one another. The acoustic wave initiation, the heating, and the traveling of the modified acoustic waves to the third location, optionally can be time synchronized with one another so as to permit sequential or parallel events and these time synchronizations are defined by the modification changes desired and the thermal properties of the material.

Illustratively, in embodiments such as described herein with reference to FIGS. 1A-1C, 2A-2B, or 3A-3C, or any other embodiments that may be envisioned, the substrate selectively can be heated using any suitable heater, such as an electron beam. For example, FIG. 4 schematically illustrates steps during yet another exemplary method for modifying an acoustic wave based on selective heating. In FIG. 4, acoustic wave 420 is initiated at a first location of substrate 410, e.g., using interdigitated electrodes such as described with reference to FIGS. 2A-2B, using one or more laser pulses such as described with reference to FIGS. 3A-3C, or using any other suitable device or method. A second location of substrate 410 that is spaced apart from the first location is irradiated with electron beam (e-beam) pulse 460 having electron beam wavelength $\lambda E$, electron beam temporal profile $\tau E$, electron beam spatial profile $\Lambda E$, and electron beam intensity profile IE. Electron beam pulse 460 selectively heats substrate 410 in the second location, thus altering a property of the second location, which altered property modifies acoustic wave 420 when the acoustic wave propagates through, in a manner such as described elsewhere herein. In another embodiment of FIG. 4, the electron beam can be an ion beam or x-ray source.

Regardless of the particular manner in which the substrate is heated, the spatial profile of the heated location suitably can be selected so as to modify a property of the acoustic wave in a desired manner. For example, FIG. 5A illustrates a plot of the simulated temperature profile of an exemplary heated region of a material as a function of radial distance. In the non-limiting example illustrated in FIG. 5A, a location of the substrate is heated centrosymmetric fashion, generating a heated region having a generally round spatial profile extending to a radial distance of approximately 0.005 m with a maximum temperature of approximately 550° C. In this example the shape of the heated region is Gaussian because it describes the extent of heated region given as a "point" source. The heated region can be any shape be either establishing a patterned heat source either via (as for example) the use of a mask or by high speed raster patterning to establish the heat source pattern on the surface. FIG. 5B illustrates a plot of exemplary changes in the phase (measured in terms of time delay (left axis) or a 100 micron "wavelength" units (right axis)) of a simulated acoustic of a plane wave propagating through the heated region of FIG. 5A as a function of radial distance. FIG. 5A also shows the thermal equation used to derive the profile. In the non-limiting example illustrated in FIG. 5B, the change in phase (as referenced at a radial distance±10 mm from the peak) of a surface acoustic wave (SAW) to smoothly change to approximately 1.09 waves or 40 ns shift (for 100 micron wavelength) at a radial distance of 0 mm (the peak of the heated region). Thus, the phase of the acoustic wave that travels directly through the middle or the wings of the heated region are different causing the plane acoustic wave to have a continuous phase lag. A sensor or a physical body (with the spatial extend of the plane wave) placed in the path of this propagating wave would "experience" an excitation sequence where the energy in the wings would arrive first followed last by the energy in the center. FIG. 5C illustrates a plot of the simulated temperature profile of another exemplary heated region of a material as a function of radial distance. In the non-limiting example illustrated in FIG. 5C, a location of the substrate is heated using a different heating profile, albeit also centrosymmetric. The generated heated region having a round spatial profile extending to a radial distance of approximately 0.01 m with a maximum temperature of approximately 550° C. See discussion regarding FIGS. 5A and 5B. FIGS. 5A and 5C along with equation show the spatial profile of the heated region for a particular set of thermal parameters for a given metal. FIG. 5D illustrates a plot of exemplary changes in the phase of a simulated acoustic wave propagating through the heated region of FIG. 5C as a function of radial distance. In the non-limiting example illustrated in FIG. 5D, the change in phase (as defined by time delay or wavelength units of a 100 micron wave) of a surface acoustic wave (SAW) referenced at a radial distance of ±10 mm from the peak of the heated region smoothly varies to approximately a phase delay of 2.9 waves (or 95 ns shift) at a radial distance of 0 mm (center). Thus, for a plane wave travelling through the heated region, the parts going through the wings of the heated region would arrive first and that through the center of the heated region would arrive last (time shifted by 95 ns). The intent of this example is to demonstrate that by changing the heating profile the amount of phase delay can be altered accordingly.

In still other examples, heating with any suitable spatial profile, e.g., a spatially inhomogeneous pattern of energy, can be used to modify one or more properties of an acoustic wave. For example, FIGS. 6A-6D schematically illustrate exemplary modifications to acoustic waves based on selective heating. In the non-limiting example illustrated in FIG. 6A, acoustic wave with a phase front profile 620 travels through heated region 630 having a profile as shown by individual rectangles of different length/width but all the same temperature. The rectangles represent the spatial extent of the heated area for each zone. The phase front profile 620' that has propagated through the heated zone is shown, for illustrative purposes, to have a phase front that varies continuously as opposed into discrete 5 sections. In common practice the heated zone would not be a set of discrete rectangles, but a shaped continuum that would be encompass the envelop profile as defined by the 5 discrete rectangles. Under these conditions, the resulting phase front profile would have the shape as shown in 620'. It can be seen that different spatial regions of heated region 630 cause different changes to the phase of corresponding spatial regions of acoustic wave 620, thus resulting in modified acoustic wave 620' that focuses at a point distal from heated region 630.

In the non-limiting example illustrated in FIG. 6B, acoustic wave with phase front 621 travels through heated region 631 having a profile as shown. In this example, the heated zones have the same area but are heated to different temperatures in contrast to the example shown in FIG. 6A where each zone was heated to the same temperature but the zone areas were different. It can be seen that different spatial regions of heated region 631 cause different changes to the phase of corresponding spatial regions of acoustic wave 621, thus resulting in modified acoustic wave 621' that focuses at a point distal from heated region 631. The intent of this example is to show that it is possible to trade off temperature with spatial area pattern to arrive at the same function (i.e. a focusing of the phase front).

In the non-limiting example illustrated in FIGS. 6C-6D, acoustic wave 622 travels through heated region 632 having a profile as shown using discrete examples for illustrative purposes. In practical application the actual heated zone would encompass the envelope area of the discrete heated zones. FIGS. 6C-6D describe two potential functions which is directing acoustic waves with heat. FIG. 6C describes how to alter the direction of a phase front that is incident normal to heated zone at 500 C without inducing curvature while FIG. 6D shows the utility of propagating a phase front at an angle to a heated zone. In the case of FIG. 6D the spatial extent of the acoustic wave is smaller than the angled boundary of the heated zone (at 500 C). Limiting the spatial extent of an acoustic wave (especially a SAW) is possible. For example by using a pulsed laser that is focused to a line of specific length where the length size conforms to the Rayleigh equation and a chosen lower "cutoff frequency". It can be described by dimensionless diffraction parameter $D=4xV/(\pi fw^2)$ where x is distance away from the source, V is the velocity of sound, f is the sound frequency and w is the beam length at the source. For $D \ll 1$ the wave fronts are planar at distance x, for frequency f and beam length w. Acoustic waves with frequencies above the "cutoff frequency" will also propagate as a plane wave "beam" over the distance, 0-x (i.e. without curvature). It can be seen that different spatial regions of heated region 632 cause different changes to the phase of corresponding spatial regions of acoustic wave 622, thus resulting in modified acoustic wave 622' that is redirected to a point distal from heated region 631.

Figure 11:
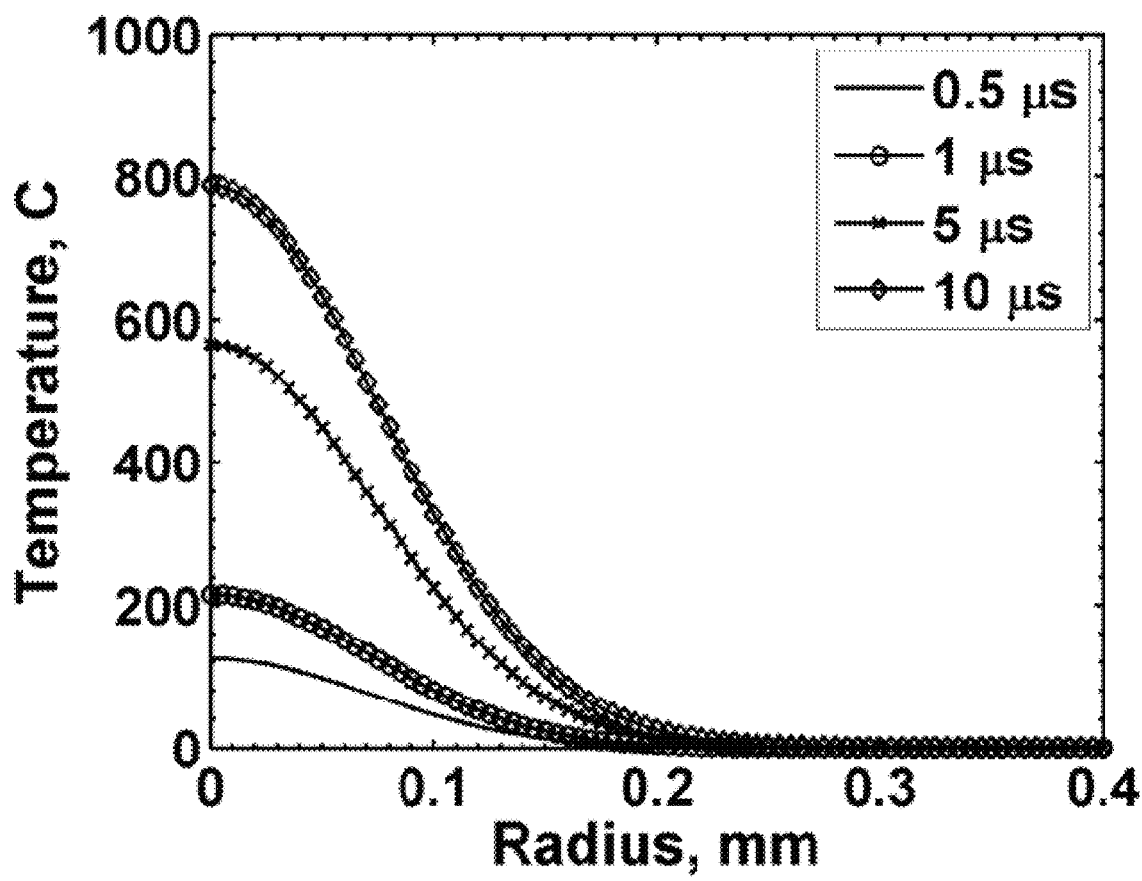
FIG. 11 illustrates a plot of exemplary simulated temperature profiles in a material as a function of radius for selected laser exposure times.

Note that in embodiments in which a region of the substrate is heated with a laser so as to modify an acoustic wave, the parameters of the laser heating suitably can be selected so as to produce the desired modification to the acoustic wave. For example, FIG. 11 illustrates a plot of exemplary simulated temperature profiles in a material as a function of radius for selected laser exposure times. In FIG. 11, a hypothetical material was irradiated with spatially centrosymmetric laser pulses having temporal durations of 0.5 µs, 1 µs, 5 µs, and 10 µs at full width at half maximum (FWHM) and spatial extent, exposure radius of 0.1 mm. It can be understood from FIG. 11 that the simulated laser pulse having of particular duration produces a temperature distribution as a function radius. For example an exposure of 10 µs caused the temperature of the material to increase to approximately 800° C. (in the center of the spot size) and a distribution of temperatures with increasing radial distance from the center; that the simulated laser pulse having a duration of 5 µs caused the temperature of the material to increase to approximately 560° C. (at the center of the spot size) and a slightly different distribution of temperatures with increasing radial distance from the center. Similarly, that the simulated laser pulse having a duration of 1 µs caused the temperature of the material to increase to approximately 200° C. at the center of the spot size); and that the simulated laser pulse having a duration of 0.5 µs caused the temperature of the material to increase to approximately 100° C. (at the center of the size). FIGS. 5A and 5C show examples of the radial distribution (a radial focus of 1 mm and 5 mm) in two dimensions.

Figure 7:
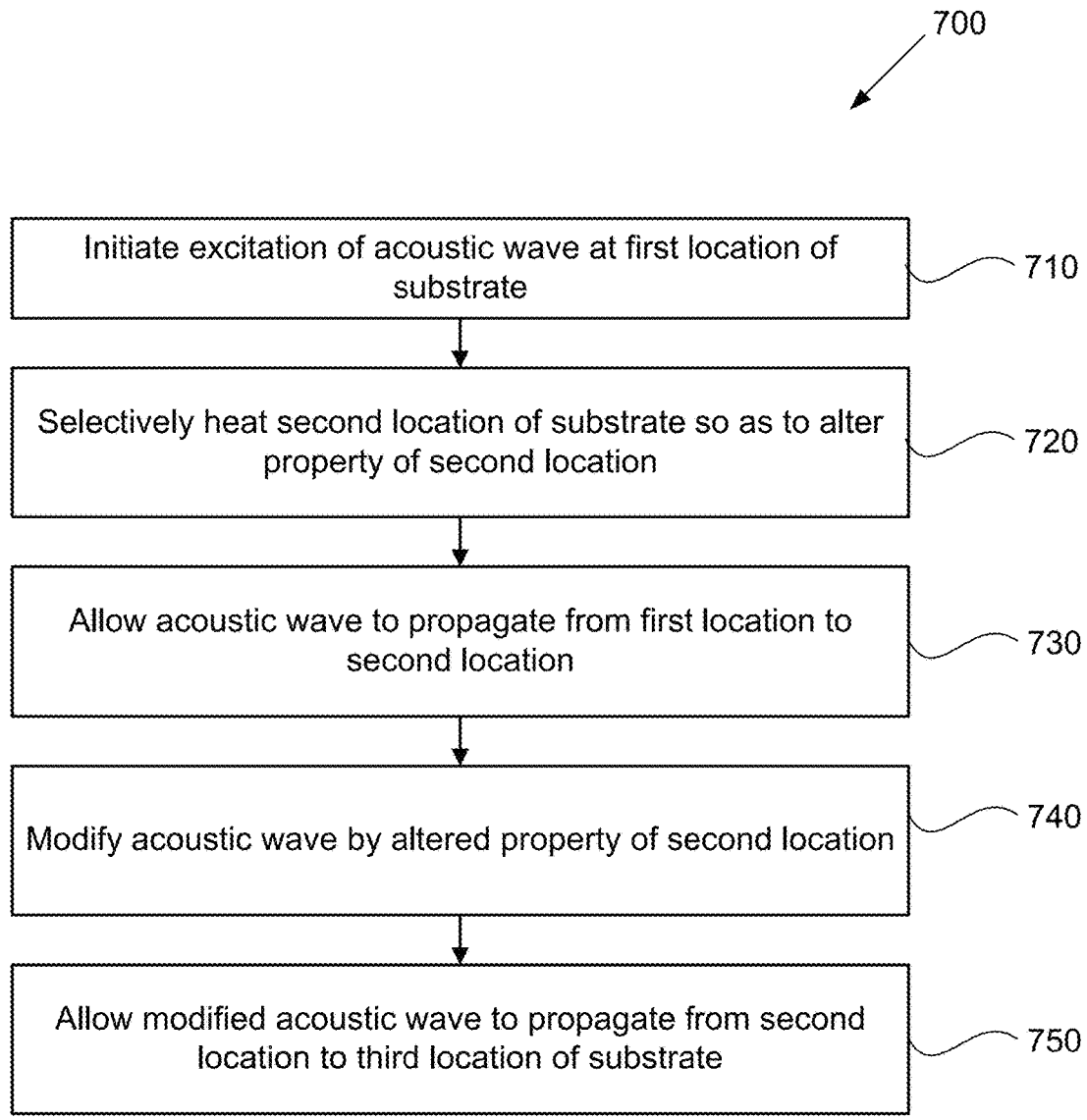
FIG. 7 illustrates a flow of steps during an exemplary method for modifying an acoustic wave based on selective heating.

Methods for modifying acoustic waves based on selective heating also are provided herein. For example, FIG. 7 illustrates a flow of steps during an exemplary method for modifying an acoustic wave based on selective heating, according to some embodiments. Method 700 illustrated in FIG. 7 can include initiating excitation of an acoustic wave at a first location of a substrate (step 710), e.g., at location 111 such as described herein with reference to FIGS. 1A-1C. The acoustic wave can be initiated using any suitable technique. For example, the first location of the substrate can include first set of interdigitated electrodes configured to initiate excitation of the acoustic wave responsive to a first voltage applied across the first and second interdigitated electrodes, e.g., in a manner such as described herein with reference to FIGS. 2A-2C. As another example, the excitation of the acoustic wave can be initiated using one or more laser pulses, e.g., in a manner such as described herein with reference to FIGS. 3A-3C. The acoustic wave can include a surface acoustic wave, or a bulk acoustic wave, or any suitable combination thereof.

Method 700 illustrated in FIG. 7 also can include selectively heating a second location of the substrate so as to alter a property of the second location (step 720), e.g., at location 112 such as described herein with reference to FIGS. 1A-1C. The second location of the substrate can be heated using any suitable technique. For example, selectively heating the second location of the substrate can include selectively irradiating the second location with a pulsed laser, e.g., such as described herein with reference to FIGS. 3A-3C, or using one or more electron or ion beam pulses or xray, e.g., such as described herein with reference to FIG. 4, or by actuating a resistive heater in a pattern contact with second location 112 of substrate 110 in a manner such as described herein with reference to FIGS. 10A-10B. Illustratively, the altered property of the second location is selected from the group consisting of a thermal property, a mechanical property, and a chemical property.

Method 700 illustrated in FIG. 7 also can include allowing the acoustic wave to propagate and/or guiding the acoustic wave from the first location to the second location (step 730), modifying the acoustic wave by the altered property of the second location (step 740), and allowing the acoustic wave to propagate and/or guiding the modified acoustic wave from the second location to a third location of the substrate (step 750), e.g., to region 113 such as described herein with reference to FIGS. 1A-1C. The altered property of the second location can modify the acoustic wave in any suitable manner, e.g., can focus or defocus the acoustic wave at the third location, or can redirect a path of the acoustic wave toward the third location, or can shift a phase of the acoustic wave, or any suitable combination thereof. Non-limiting examples of modifications to acoustic waves based on altered properties of the substrate are provided herein with reference to FIGS. 5A-6B and 11.

Optionally, method 700 can include the modified acoustic wave, e.g., at the third location. For example, the third location of the substrate can include interdigitated electrodes configured to generate a voltage across the electrodes responsive to receipt of the modified acoustic wave. As another example, the sensing can include irradiating the third location with a laser beam.

As noted elsewhere herein, it should be appreciated that the substrate can include any suitable material or combination of materials. For example, the first location can be disposed at a first material of the substrate, the second location can be disposed at a second material of the substrate, and the third location can be disposed at a third material of the substrate, wherein the second material can include, but need not necessarily can include, a different material than does the first material and the third material. While the materials can be different, the acoustic impedances at the boundary regions should be close if maximum propagation of wave energy across materials is desired. Optionally, at least one of the first location, the second location, and the third location is embedded within the substrate.

Figure 8:
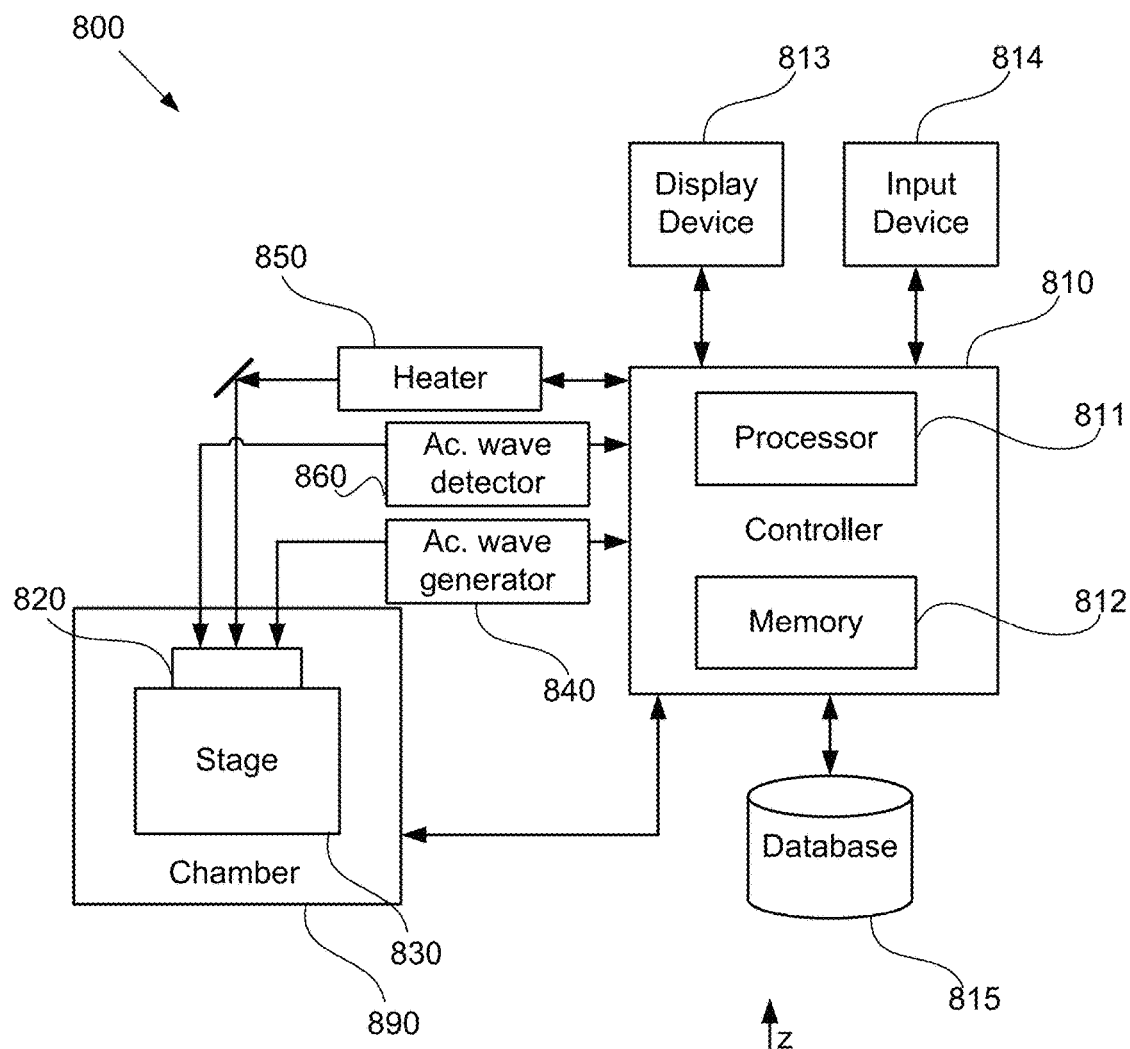
FIG. 8 schematically illustrates selected components of an exemplary system for modifying an acoustic wave based on selective heating.

Non-limiting embodiments such as provided herein can be implemented using any suitable combination of hardware and software. For example, FIG. 8 schematically illustrates selected components of an exemplary system for modifying an acoustic wave based on selective heating. System 800 illustrated in FIG. 8 suitably can be configured so as to implement method 700 illustrated in FIG. 7, as well as any other suitable method for processing a monitoring temperature using acoustic waves during processing of a material. FIG. 8 depicts functional components for investigating the parameters that would modify an acoustic wave based on selective heating in a particular desirous manner. Once the parameters have been determined, it is expected that for the application a multilayer chipset device would have to be built that would generate the ultrasound wave and the specific patterned heating and dose in time synchronous for the desired modification.

System 800 illustrated in FIG. 8 includes controller 810, acoustic wave generator 840, heater 850, acoustic wave detector 860, and optional chamber 890. Controller 810 suitably can be coupled to acoustic wave generator 840, heater 850, acoustic wave detector 860, and optional chamber 890.

In the exemplary embodiment illustrated in FIG. 8, controller 810 includes memory 812 (e.g., a non-transitory computer-readable medium) configured to store processing instructions, processor 811 configured to store the stored processing instructions, display device 813 configured to display data to a user, and input device 814 configured to accept input from a user. Controller 810 also can be in operable communication with database 815, which can store information on how to generate, modify, and detect acoustic waves initiated in substrate 820. Database 815 can be integral to controller 810, or can be remote to controller 810 and in operable communication with controller 810 via a network, such as the Internet.

Acoustic wave generator 840, heater 850, and acoustic wave detector 860 can be configured so as suitably to interact with substrate 820 disposed within chamber 890. For example, in embodiments in which acoustic wave generator 840, heater 850, or acoustic wave generator 860 include a laser or electron beam source, any suitable combination of reflective or transmissive elements can be used so as to direct a laser beam or electron beam generated by such source towards substrate 820. Chamber 890 can include an optical window (not shown) via which one or more of acoustic wave generator 840, heater 850, and acoustic wave detector 860 can access substrate 820, (in the case of the electron or ion beam heaters the source is inside the chamber) which in some embodiments can be disposed on stage 830. Stage 830 can be positioned within chamber 890 and can support substrate 820, and can be operable to adjust the position of the substrate in the x, y, and z directions responsive to instructions from controller 810. Alternatively, one or more of acoustic wave generator 840, heater 850, and acoustic wave detector can be directed towards substrate 820 using a high speed scanning reflective or transmissive element, optionally including a compensating Z-motion focus unit, that respectively is configured to direct acoustic wave generator 840, heater 850, or acoustic wave detector 860 towards substrate 820 while maintaining the substrate in a stationary position. For example, for relatively large chambers (e.g., chambers configured to accommodate an article having an area of one or more square meters) it may be useful to maintain substrate 820 in a substantially fixed position, while using optical elements (if a laser is use) so as respectively to direct energy from acoustic wave generator 840, heater 850, and acoustic wave detector 860 towards different regions of substrate 820 responsive to appropriate signals provided by controller 810. Other beam directing approaches would be needed if the acoustic wave generated and heater for example are excited by an electron beam.

Acoustic wave generator 840 can include any suitable device configured to initiate an acoustic wave within substrate 820, e.g., responsive to a suitable command provided by controller 810. For example, in some embodiments, acoustic wave generator 840 can include a pulsed laser configured to emit light of a wavelength selected to be absorbed by substrate 820 so as to cause rapid thermal expansion of an irradiated region of substrate 820, and thus initiate an acoustic wave. In still other embodiments, acoustic wave generator 840 can include a pulsed particle beam source, a piezoelectric device, or any other suitable custom or commercially available device, or device yet to be developed. Illustratively, acoustic wave generator 840 can include first and second interdigitated electrodes configured to initiate the acoustic wave responsive to a first voltage applied across the first and second interdigitated electrodes. The acoustic wave generated by acoustic wave generator 840 can include a surface acoustic wave, a bulk acoustic wave, or any suitable combination thereof.

Heater 850 can include any suitable device configured to heat a second location of substrate 820, e.g., responsive to a suitable command provided by controller 810. In some embodiments, heater 850 can include a laser, a particle beam source, e.g., a source of an electron beam, neutron beam, or proton beam, a resistive heater in contact with the second location of the substrate, or any other suitable custom or commercially available device, or device yet to be developed. Optionally, the laser or the particle beam (e.g., electron beam) can be pulsed. Heater 850 can be configured so as to generate sufficient energy so as to, in most applications, temporarily alter the property of the second location. As noted elsewhere herein, the altered property is selected from the group consisting of a thermal property, a mechanical property, and a chemical property. The acoustic wave can travel through the second location to a third location. The altered property of the second location can focus or defocus the acoustic wave at the third location, or can redirect a path of the acoustic wave toward the third location, or can shift a phase of the acoustic wave, or any suitable combination thereof.

Acoustic wave detector 860 (sensor) can include any suitable device configured to detect an acoustic wave within substrate 820, e.g., at a third location of the substrate, responsive to a suitable command provided by controller 810. For example, in some embodiments, acoustic wave detector 860 can include a laser configured to generate a laser beam that irradiates the surface of substrate 820 and detects the arrival time or the disturbance (e.g. surface displacement for SAWs) amplitude, or both the arrival time and the disturbance amplitude, of a modified acoustic wave that has traveled through the second, heated region of the substrate. Alternatively, acoustic wave detector 860 can include any suitable combination of hardware and software configured to detect an acoustic wave, such as a piezoelectric device, or any other custom or commercially available device or device yet to be developed. In some embodiments, a narrow band CW laser can be configured into a heterodyne surface displacement sensor to enable ultrasonic wave displacements on the order of an Angstrom. The ability to "sense" very small amplitude displacements can reduce the amount of power applied using acoustic wave generator 840. In another example, the third location of the substrate includes interdigitated electrodes configured to generate a second voltage across the interdigitated electrodes responsive to receipt of the modified acoustic wave, e.g., such as described herein with reference to FIGS. 3A-3C.

In some embodiments, responsive to user input provided through input device 814, e.g., user input defining material (s) of substrate 820, one or more properties of the acoustic wave to be modified, and any other suitable processing parameters, controller 810 requests database 815 to provide information on how to perform such processing. Responsive to the request, database 815 provides some or all of the following information to controller 810: the type of material (s) of substrate 820; parameters defining the acoustic wave to be initiated; parameters defining the heating of substrate 820; parameters defining the detection of the modified acoustic wave; and parameters defining implementation of relative movement (if any) between substrate 820, acoustic wave generator 840, heater 850, and acoustic wave detector 860, e.g., a trajectory or path in x-y-z space of stage 830 or respective trajectories or paths in x-y-z space of any such components. Controller 810 receives this information and stores it in memory 812. Processor 811 processes the stored information, and based on that information optionally displays instructions to the user via display device 813 and controls stage 820, acoustic wave generator 840, heater 850, acoustic wave detector 860, any suitable optical elements, and chamber 890 so as to modify acoustic waves initiated within substrate 820 as appropriate.

For example, in some embodiments, controller 810 illustrated in FIG. 8 can be configured so as to control heater 850 so as to heat a second location of substrate 820 through which the acoustic wave subsequently travels. Illustratively, memory 812 can store appropriate instructions for causing processor 811 to send an appropriate signal to heater 850 so as to cause heater 850 to emit energy at a suitable power, suitable duration, with suitable focus, and along a suitable path or trajectory towards substrate 820 as to heat a second region of the substrate 820 through which the acoustic wave travels. Memory 812 also can store appropriate instructions for causing processor 811 to send an appropriate signal to stage 830 so as to move along an appropriate trajectory or path in x-y-z space. In one illustrative embodiment, under control of controller 810, heater 850 implements step 720 of method 700 described herein with reference to FIG. 4.

Controller 810 illustrated in FIG. 8 further can be configured so as to control acoustic wave generator 840 so as to excite an acoustic wave in substrate 820. The acoustic wave can be transmitted through the heated region of the material, and the heated region of the material can change at least one property of the first acoustic wave in a manner such as provided elsewhere herein. Illustratively, memory 812 can store appropriate instructions for causing processor 811 to send an appropriate signal to acoustic wave generator 840 so as to cause acoustic wave generator 840 to excite an acoustic wave at an appropriate (first) location of substrate 820. In embodiments in which acoustic wave generator 840 includes a pulsed laser or pulsed particle beam, memory 812 can store instructions for causing processor 811 to send an appropriate signal to acoustic wave generator 840 to cause acoustic wave generator 840 to emit energy at a suitable power, with suitable focus, and along a suitable path or trajectory towards substrate 820. In one illustrative embodiment, under control of controller 810, acoustic wave generator 840 implements step 710 of method 700 described above with reference to FIG. 7.

Controller 810 illustrated in FIG. 8 further can be configured so as to control acoustic wave detector 860 so as to detect the change in at least one property of the acoustic wave responsive to propagation of the acoustic wave through the heated, second region of substrate 820. Illustratively, memory 812 can store appropriate instructions for causing processor 811 to send an appropriate signal to acoustic wave detector 860 to cause acoustic wave detector 860 to detect the acoustic wave at an appropriate location of substrate 820. For example, the change in at least one property of the acoustic wave can include a change in an arrival time, a change in a disturbance amplitude or shape (e.g., profile) or changes both in the arrival time and the disturbance amplitude or shape, of at least one frequency component of the acoustic wave. In some embodiments, acoustic wave detector 860 can include a laser configured to emit a laser beam arranged to detect the change in the arrival time, the change in the disturbance amplitude, or the changes both in the arrival time and the disturbance amplitude, of the at least one frequency component of the acoustic wave based on receiving laser light reflected from substrate 820. Memory 811 can store appropriate instructions for causing processor 811 to send an appropriate signal to cause acoustic wave detector 860 to emit such a laser beam at a suitable power, with suitable focus, and along a suitable path or trajectory towards substrate 820, and to cause acoustic wave detector 860 to receive and properly analyze the laser light reflected by substrate 820. In other embodiments, acoustic wave detector 860 can be configured to detect the change in the arrival time, the change in the disturbance amplitude, or the changes both in the arrival time and the disturbance amplitude, of the at least one frequency component of the acoustic wave based on receiving the acoustic wave from substrate 820 using a piezoelectric device. In still other embodiments, acoustic wave detector 860 can be configured to detect the change in the arrival time, the change in the disturbance amplitude, or the changes both in the arrival time and the disturbance amplitude, of the at least one frequency component of the acoustic wave based on receiving a phonon emission from substrate 820, where such phonon emission is generated by the conversion of short pulse optical photons into phonons by the material.

Those of skill in the art will appreciate that any of the user-performed steps may alternatively be automated using commercially available equipment (not illustrated). For example, in certain industrial applications, a process script profile may be provided that controls chamber 890, acoustic wave generator 840, heater 850, acoustic wave detector 860, stage 830, relative motion, and timing. It also should be appreciated that substrate 820 can include any suitable combination of materials. In one example, the first location is disposed at a first material of the substrate, the second location is disposed at a second material of the substrate, and the third location is disposed at a third material of the substrate, wherein the second material optionally includes a different material than does the first material and the third material. At least one of the first location, the second location, and the third location optionally can be embedded within the substrate. Moreover, those skilled in the art will appreciate that the processes (i.e. modification of the acoustic wave) induced at the second location can be parsed such that there a multitude of locations (e.g., a fourth location different from each of the first, second, and third locations, etc.) where each alters the propagating acoustic wave the same or differently but in sequential fashion.

It should be appreciated that the present systems and methods suitably can be used so as to modify acoustic waves using selective heating, in a variety of practical applications. For example, the propertie(s) of one or more portions of an acoustic wave can be modified so as to correct for manufacturing variations in a substrate that otherwise may cause defocusing of the acoustic wave or deviation of the acoustic wave from a desired path, thereby enhancing the precision of a measurement or other function performed by the acoustic wave.

As another example, the propertie(s) of one or more portions of an acoustic wave can be modified so as to facilitate different forms of signal processing. Illustratively, a multi input (e.g., multiport) processing device can include one or more heaters configured so as selectively to heat locations of a substrate so as to cause two or more acoustic waves to interact with one another, such interaction providing a processed signal output, such as a mathematical convolution or other operation.

In some embodiments, the present systems and methods selectively can heat the second location of the substrate using an array of spatially distributed heaters, e.g., an array of spatially distributed pulsed lasers or other suitable sources of heat, so as to locally modify one or more properties of an acoustic wave, e.g., one or more of an arrival time and a phase front of the acoustic wave. In one nonlimiting example suitable for use in radar or signal processing, the substrate in which the acoustic wave propagates, e.g., lithium niobate, quartz, or a piezoelectric material, optionally which includes interdigitated electrodes for generating the acoustic waves in a manner such as described above with reference to FIGS. 2A-2B, is overlaid with a spatially patterned array of addressable lasers, such as an array of vertical cavity surface emitting lasers (VCSELs). These lasers can be controlled, e.g., using a controller such as controller 810 described above with reference to FIG. 8, so as respectively to emit bursts of laser light that locally heat the substrate in which the acoustic waves propagates at appropriate times, thereby inducing transient effects on one or more different spatial or temporal portions of the acoustic wave, e.g., focusing one or more portions of the wave, delaying one or more portions of the wave, or redirecting a path of one or more portions of the wave.

Figure 9A:
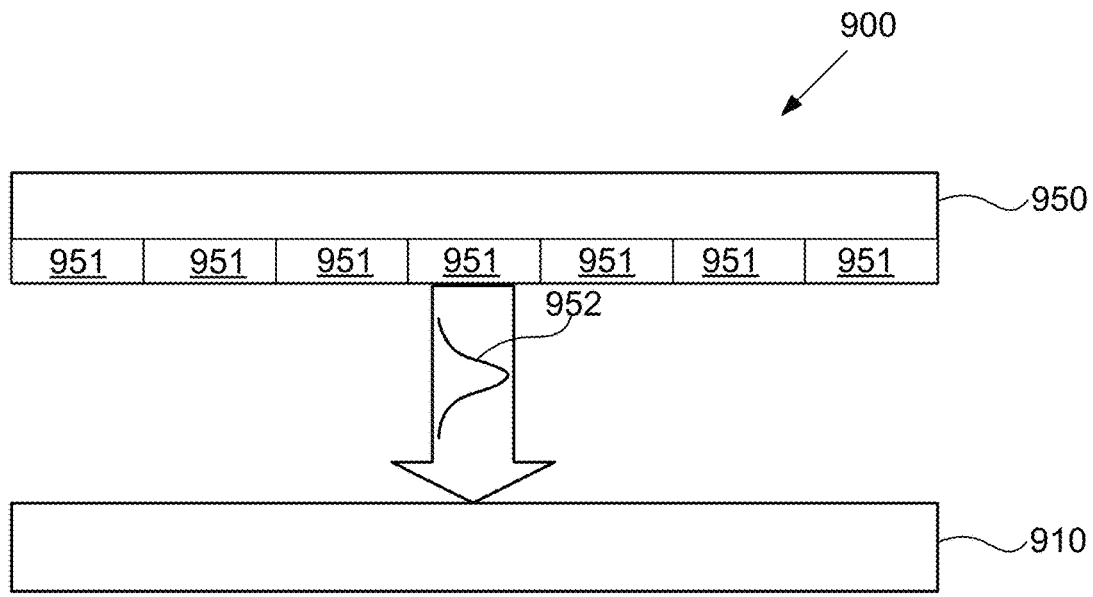
FIGS. 9A-9B schematically illustrate selected components of an exemplary system for modifying an acoustic wave based on selective heating.
Figure 9B:
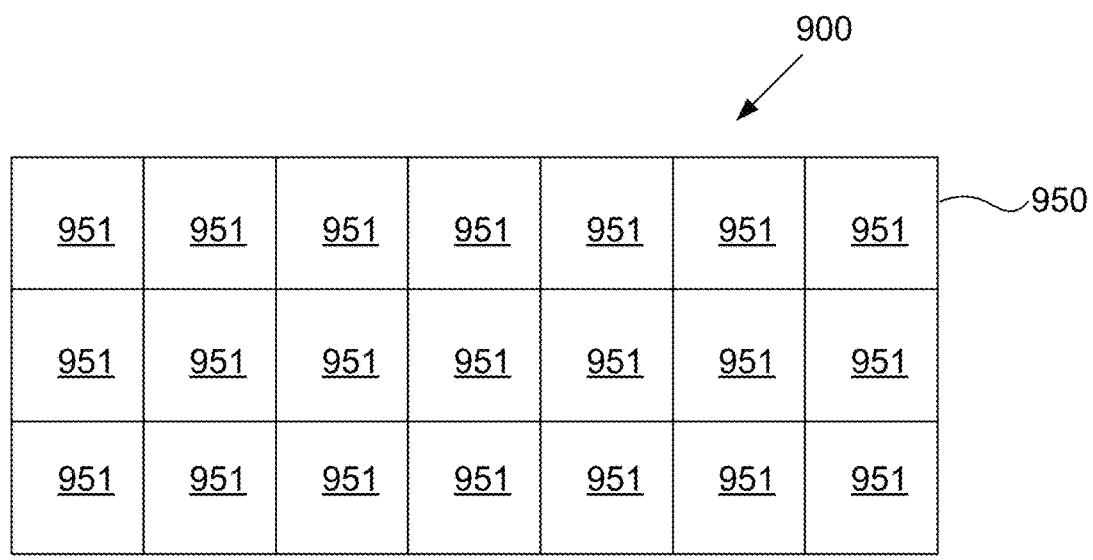

For example, FIGS. 9A-9B schematically illustrate selected components of an exemplary system for modifying an acoustic wave based on selective heating. FIG. 9A illustrates a cross-sectional view of selected components of system 900, and FIG. 9B illustrates a plan view of selected components of system 900. System 900 includes heater 950 including an array of individually addressable lasers 951, e.g., an array of VCSEL lasers or a bundled array of optical fibers disposed on a common wafer substrate, that respectively are positioned over different locations of substrate 910 so as to addressably irradiate such locations with laser pulses 952. The lasers 951 of the addressable array of lasers can be delivered by a bundled or co-fabricated photonic beam delivery device, by a fast scanning XYZ programmable galvanometer, or any other suitable device configured so as to generate a plurality of laser beams.

Figure 10A:
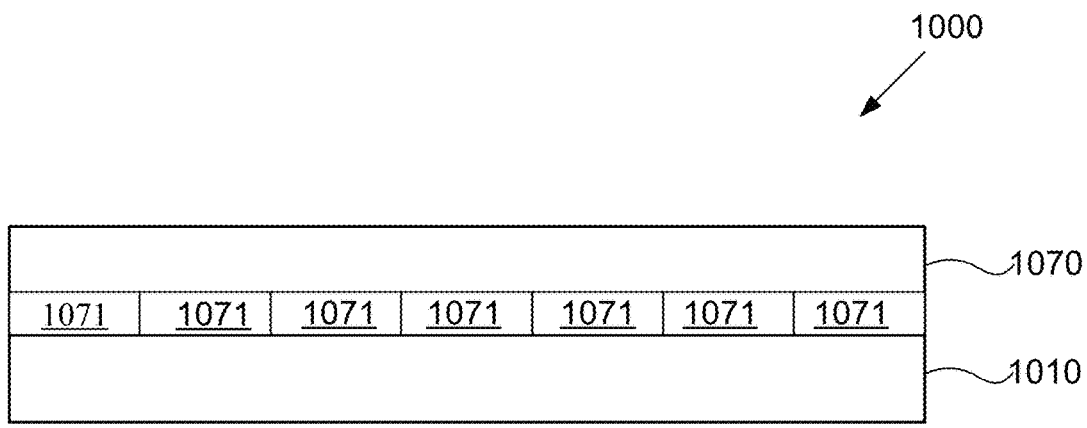
FIGS. 10A-10B schematically illustrate selected components of an exemplary system for modifying an acoustic wave based on selective heating.
Figure 10B:
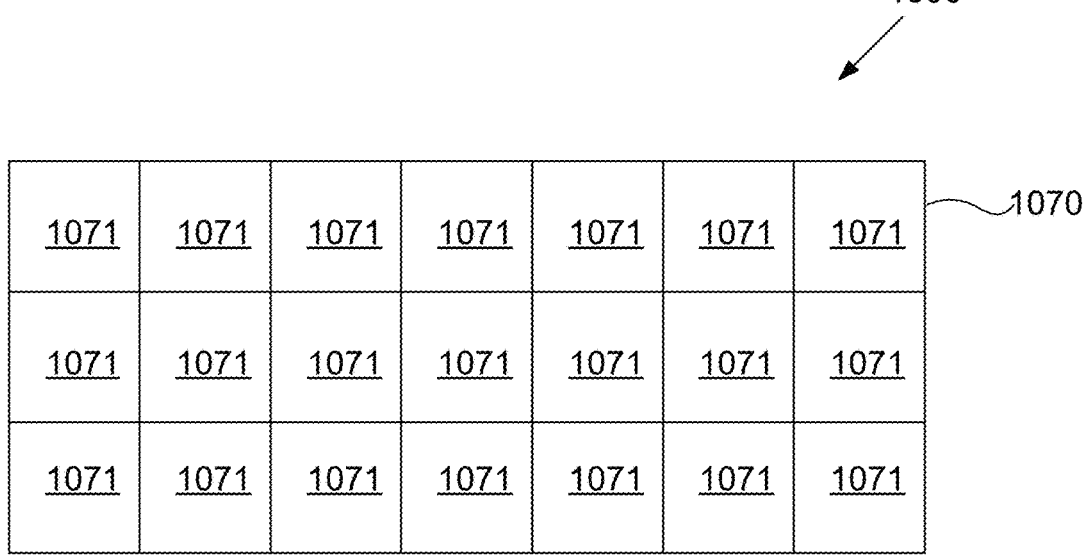

FIGS. 10A-10B schematically illustrate selected components of another exemplary system for modifying an acoustic wave based on selective heating. FIG. 10A illustrates a cross-sectional view of selected components of system 1000, and FIG. 10B illustrates a plan view of selected components of system 1000. System 1000 includes heater 1070 including an array of individually addressable resistive heaters 1071 that respectively are positioned over and in contact with different locations of substrate 1010 so as to provide addressable resistive heating at such locations.

In exemplary applications such as radar or signal processing, the present systems and methods can be used to modify acoustic waves so as to generate coded waveforms for transmission, to pulse compress such waveforms, to provide precise frequency filtering (e.g., for band pass filtering or side lobe filtering, e.g., by providing structural resonances in the material), to provide a delay line (e.g., to delay the propagation of the acoustic waves), or to provide phase shift keying (PSK), or to provide any suitable combination of such features at the same time or at different times than one another. For example, referring again to the nonlimiting embodiment illustrated in FIGS. 2A-2B, applying a time resolved and spatially patterned heat load at region 230 of substrate 210, e.g., using an array such as described with reference to FIGS. 9A-10B, can control or alter a signal processing task. For example, a particular type of processing "circuit" can be made to change—even for a brief moment, such as on the order of tens of picoseconds—so as to function as a different type of signal processing "circuit." As such, the present systems and methods can be considered to provide "programmable" circuits for dynamically modifying acoustic waves for a variety of suitable practical applications, including but not limited to radar and signal processing.

Figure 12:
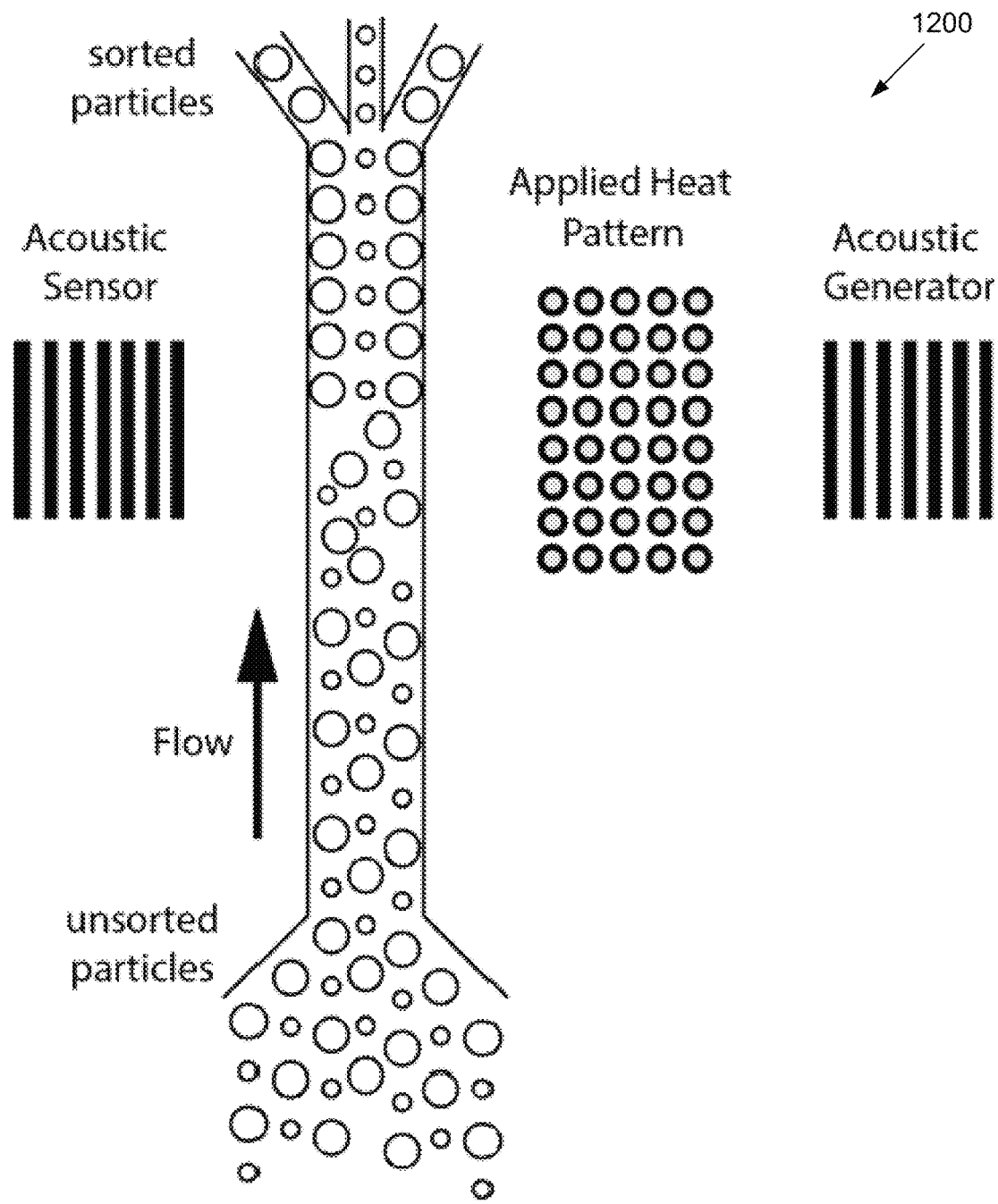
FIG. 12 schematically illustrates selected components of an exemplary system for modifying acoustic waves so as to sort particles based on selective heating.

As another example, the present systems and methods suitably can be used in microfluidics so as to control the flow of a liquid or of a species in the liquid, e.g., particles or cells. For example, cell sorters can use the present systems and methods so as to direct a fluid, particles, or cells into specific bins or chemical ports, or so as to control flow directionality or flow properties, such as turbulence, laminarity, or focusing. Illustratively, FIG. 12 schematically illustrates selected components of an exemplary system for modifying acoustic waves so as to sort particles based on selective heating. System 1200 illustrated in FIG. 12 includes an acoustic wave generator (not specifically illustrated and a microfluidic channel through which a fluid (e.g., liquid or gas) suspending particles of different size is flowing (schematically illustrated using circles disposed within defined region of FIG. 12) and an applied heat pattern area (schematically illustrated by circles with bold lines). The acoustic waves (represented using parallel vertical bars) can generate standing waves in the microfluidic channel (if the applied heat pattern is turned OFF) or moving pressure gradients by an applied phase shift induced by the applied heat pattern. Regardless, the acoustic waves can be directed through the microfluidic channel so as to generate pressure gradients in the fluid that cause the particles to be physically moved from one lateral location within the microfluidic channel to another lateral location in the channel. However, the standing waves cannot sort efficiently and may have to slightly modified, dithered (time dependent phase change). Illustratively, the sorted particles can enter a specified flow channel in a manner such as illustrated in FIG. 12. For further details regarding the use of SAWs in microfluidics and small bio devices, see the following references, the entire contents of each of which are incorporated by reference herein: Sajeesh et al., "Particle separation and sorting in microfluidic devices: a review," Microfluid Nanofluid 17:1 (2014); Xuan et al., "Particle focusing in microfluidic devices," Microfluid Nanofluid 9: 1 (2010); and Leong et al., "Ultrasonic separation of particulate fluids in small and large systems: a review," Ind. Eng. Chem. Res. 52: 165 (2013).

FIGS. 13A-D schematically illustrates selected components of an exemplary system for modifying acoustic waves so as to generate a phononic (most commonly a frequency selective device) structure based on selective heating. In system illustrated in FIG. 13A, a broadband acoustic wave having the exemplary energy distribution illustrated in the inset on the upper left side of FIG. 13A is excited at a first location of the substrate. The acoustic wave includes components at frequencies $f_1$, $f_2$, and $f_3$ such as individually schematically illustrated on the lower left side of FIG. 13A. Selective heating of a second location of the substrate is used to generate a phononic bandgap structure such as schematically illustrated by the array of circles in the central region of FIG. 13A. For example, a laser beam can irradiate a pixilated mirror, with addressable attenuation, so as to generate a plurality of laser beams, and a lens or other suitable optical element (or feature of the pixilated mirror) can suitably direct or focus the beams towards different portions of the second region of the substrate. The beams can alter a property of the substrate in a spatially periodic manner so as to generate a phononic bandgap structure. For example, the resulting phononic bandgap structure can include altered portions of the substrate with a density or acoustic impedance and a spatial periodicity selected so as to partially or fully block propagation of acoustic frequency component $f_2$, while permitting propagation of acoustic frequency components $f_1$ and $f_3$, such as illustrated in the inset on the upper right side of FIG. 13A and as schematically illustrated on the lower right side of FIG. 13A. Simple enhancements to the example shown in FIG. 13A include the addition of pixelated spatial attenuators (e.g. saturable absorber) to allow control of the laser power for each individual ray (or beam).

Figure 13B:
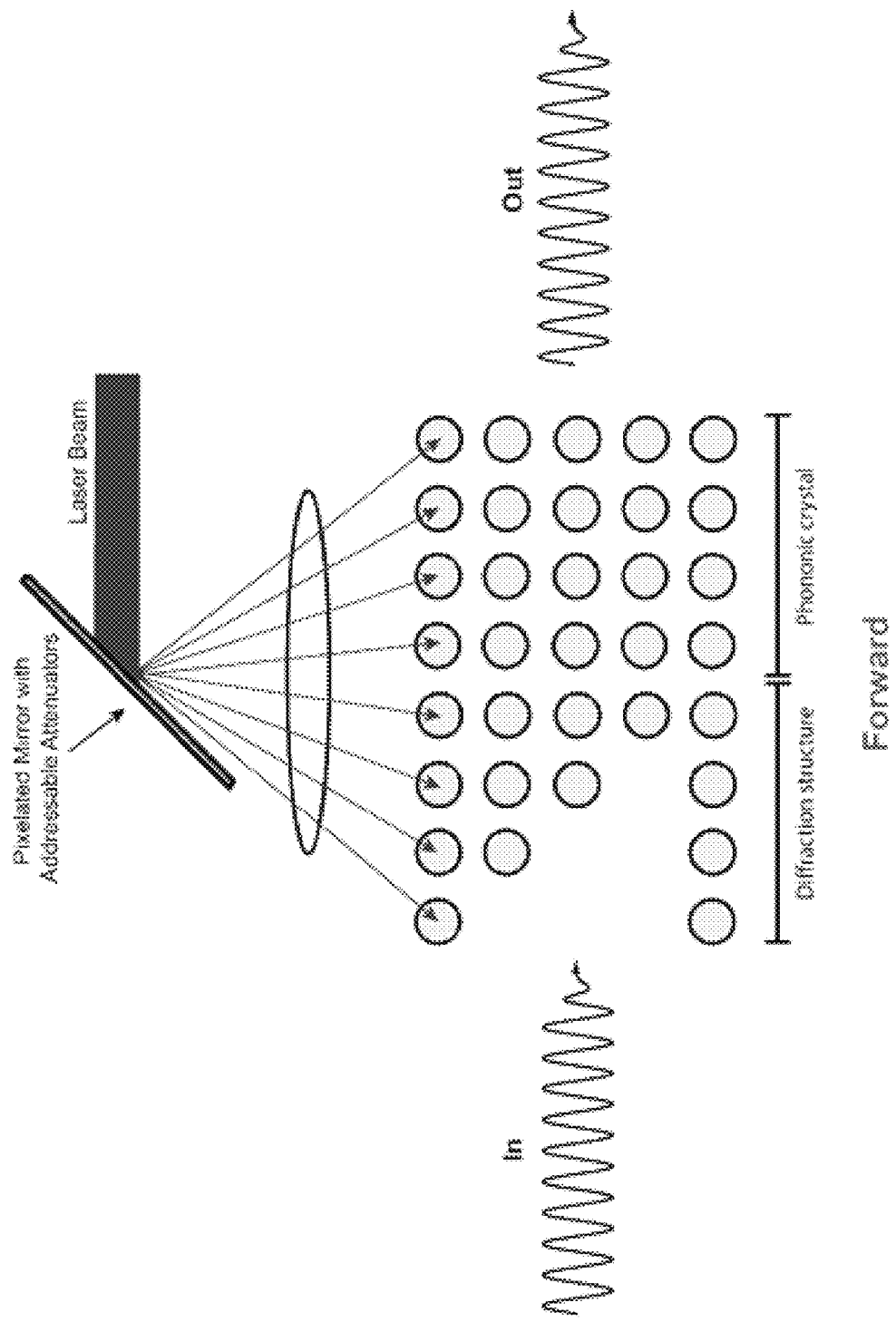
Figure 13C:
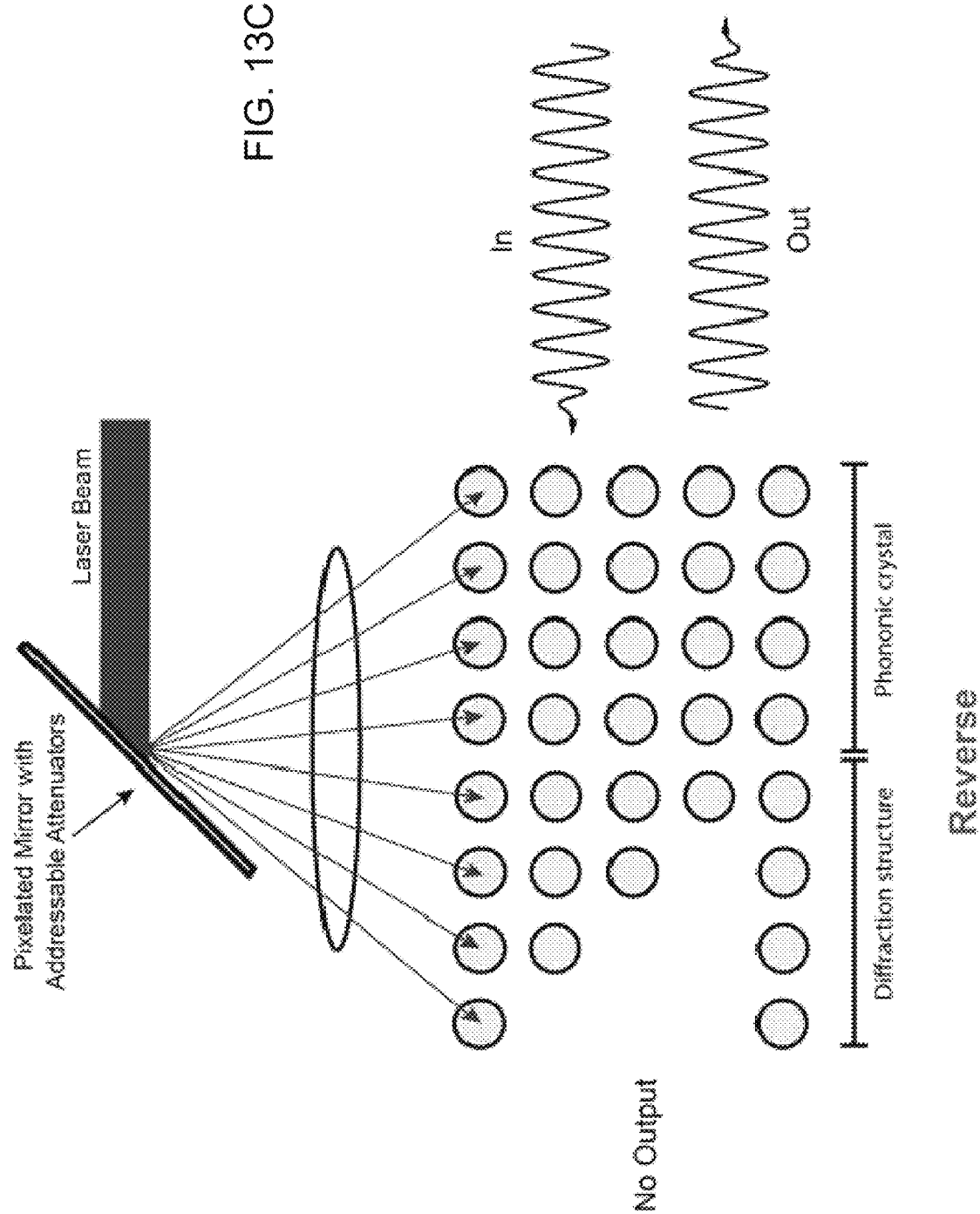

In another example, acoustic metamaterials allow for the modification of sound for useful purposes, such as exotic sound cancellation and acoustic imaging. In a similar manner as illustrated in FIG. 13B (a phononic based isolator where there is transmission in the forward direction FIG. 13B but not in the reverse FIG. 13C), the present systems and methods can be used to generate real-time reconfigurable active metamaterials that expand previously known abilities to control sound by providing for tunable metamaterials as illustrated in FIG. 13D where the light and dark heated regions are designed for different functionality (e.g. the lighted region as a defect which alters the properties of the overall phononic function). Besides being reconfigurable in real-time, another useful feature is that these systems can implement acoustic properties not readily available in traditional metamaterials, such as the specific isolation and utilization of second harmonics in a similar manner such as described in Popa et al., "Active acoustic metamaterials reconfigurable in real time," Phys. Rev. B 91: 220303(R) (2015), the entire contents of which are incorporated by reference herein.

In still another example, the present systems and methods suitably can be used so as to provide still further control over the enhancement of mobility of atomic or molecular species on a substrate. For further details regarding enhancing the mobility of atomic or molecular species on a substrate, see the following references, the entire contents of both of which are incorporated by reference herein: Manzo et al., "Demonstration of enhanced surface mobility of adsorbate cluster species by surface acoustic wave excitation induced by a pulsed laser," Proc. SPIE 8969 (2014); and U.S. Patent Publication No. 2014/0199550 to Helvajian, entitled "Systems and methods for enhancing mobility of atomic or molecular species on a substrate at reduced bulk temperature using acoustic waves, and structures formed using same." Illustratively, the present systems and methods can be used so as to pattern or move atomic or molecular species along a surface, in a desired direction and by moving these species into specific locations (e.g. building up concentration) the material properties are sufficiently altered to modify an acoustic (e.g. SAW) wave propagating through this molecular/atomic concentration gradient.

As another example, ultrasonic microscopy is widely used in nondestructive examinations of flat samples, e.g., so as to look for bonding delamination. The present systems and methods can be used so as to generate localized heating zones that can tune or refine ultrasonic wave propagation, e.g., so as to better guide or focus the waves for better resolution in ultrasonic microscopy. For further details regarding ultrasonic microscopy, see the following references, the entire contents of both of which are incorporated by reference herein: Kino, "Acoustic Waves: Devices, Imaging, and Analog Signal Processing," Simon & Schuster (1987, corrected edition 2000); and Briggs, "Acoustic microscopy—a summary," Rep. Prog. Phys. 55: 851 (1992).

In still another example, in some applications, acoustic waves can be deleterious to sensitive components and devices. For example, there is a strong technology push to develop "quantum" devices that have exquisite sensitivity but include delicate and sometimes suspended structures placed in close proximity so as to harness the quantum effect. Sound is ubiquitous. While technology exists to suppress bulk sound waves, particularly at sub-ultrasonic frequencies, e.g., by proper choice of sound-absorbing materials or suspension schemes, the present systems and methods can be used to suppress surface-propagating acoustic waves, e.g., by "guiding" such waves away from delicate structures.

In still another example, in some applications, where precision cooling devices can be integrated like thermoelectric cooling devices (in solitary form or in arrays), acoustic waves can also be guided, albeit it is easier to guide with heating.

In still another example, in some applications, such as thermoacoustic engines for thermoacoustic refrigeration, where controlled sound waves are used to cool. The guiding of sound waves for maximum cooling efficiency may require controlling the applied phase and amplitude of the sound wave.

In still another example, in some applications and for larger scale, the controlled application of acoustic waves have shown to decrease drag reduction in fluidics (liquid, gas). For example, drag reduction is key to moving of fluids through pipes efficiently or over wing foils (e.g. airplane flight). Consequently, it has been shown that drag is associated with local turbulence and this turbulence can be suppressed selective inducement of acoustic waves of a particular wavelength and property and these attributes are specific to the topology of the surface where the turbulent action is occurring. Methods as shown in FIGS. 1-10 can be used to control and modify the suppression wave source properties for maximum efficiency. For further details regarding ultrasonic wave suppression, see the following references, the entire contents of both of which are incorporated by reference herein: Y. Du et al. J. Fluid Mech (2002, vol, 457 pp 1-34, "Drag reduction in wall-bounded turbulence via a transverse travelling wave".

As such it should be appreciated that the present systems and methods can be used so as to modify the shape or profile, or other suitable property, of an acoustic wave, e.g., using CW (or pulsed) lasers that are amplitude modulated into articulate pulse profiles, which can be arrayed and reduced to chip scale (e.g., VCSELs) and synchronized to picosecond time accuracies. By depositing a precise amount of energy (e.g., heat) at a selected local area of a substrate, an acoustic wave can be delayed slightly upon traversing the heated zone. Consequently, but establishing a suitable pattern of one or more heated spots (e.g., illuminated spots), the propagating phase front of an acoustic wave can be bent or curved. For example, changes in the elastic modulus of the substrate can be caused by localized and transient heated zones that, illustratively, can be established by a pattern of one or more laser illuminations. Surface acoustic waves (SAWs) are used in radar systems, in high frequency (>100 MHz) systems, and in microwave signal processing circuits, e.g., so as to provide signal delay lines, filters, and chip based circuits for mathematical computation (e.g., convolution). Such two-port or multiport devices have a similar chip design as one another, e.g., including a SAW source including an interdigitated electrode patterned on a substrate surface, a gap (physical space) through which the SAW propagates, and another interdigitated electrode that serves as a sensor. According to the present systems and methods, the gap can be selectively heated in a suitable manner, e.g., in synchronous fashion, so as to provide a transient distribution of one or more heated zones that can precisely effect the SAW.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed:

1. A method for modifying an acoustic wave comprising:
   initiating excitation of an acoustic wave from a first location on a substrate to a second location on the substrate; and
   selectively heating, independently of the initiating excitation of the acoustic wave, the second location of the substrate so as to alter a property of the second location, the altered property of the second location modifying the acoustic wave to result in a modified acoustic wave that is propagated from the second location to a third location on the substrate.

2. The method of claim 1, wherein the selectively heating is initiated subsequent or prior to the initiation of excitation of the acoustic wave but prior to the acoustic wave arriving at the second location on the substrate.

3. The method of claim 1, further comprising:
   selectively heating the third location of the substrate so as to alter a property of the third location, the altered property of the third location further modifying the acoustic wave to result in a further modified acoustic wave that is propagated from the third location to a fourth location on the substrate.

4. The method of claim 1, wherein the acoustic wave includes a surface acoustic wave.

5. The method of claim 1, wherein the acoustic wave includes a bulk acoustic wave.

6. The method of claim 1, wherein the altered property of the second location is selected from the group consisting of a thermal property, a mechanical property, and a chemical property.

7. The method of claim 1, wherein the altered property of the second location focuses or defocuses the acoustic wave at the third location.

8. The method of claim 1, wherein the altered property of the second location redirects a path of the acoustic wave toward the third location.

9. The method of claim 1, wherein the altered property of the second location shifts a phase of the acoustic wave.

10. The method of claim 1, wherein the first location of the substrate includes a first set of interdigitated electrodes configured to initiate excitation of the acoustic wave responsive to a first voltage applied across the first set of interdigitated electrodes.

11. The method of claim 10, wherein the third location of the substrate includes a second set of interdigitated electrodes configured to generate a second voltage across the second set of interdigitated electrodes responsive to receipt of the modified acoustic wave.

12. The method of claim 1, wherein the selectively heating the second location of the substrate comprises selectively irradiating the second location with a short or long pulsed laser or a continuous laser.

13. The method of claim 1, wherein the selectively heating the second location of the substrate comprises selectively irradiating the second location with an electron beam.

14. The method of claim 1, wherein the selectively heating the second location of the substrate comprises actuating a resistive heater in contact with the second location of the substrate.

15. The method of claim 1, wherein the selectively heating the second location of the substrate comprises initiating a chemical reaction that produces heat at the second location of the substrate.

16. The method of claim 1, further comprising sensing the modified acoustic wave at the third location.

17. The method of claim 16, wherein the sensing comprises irradiating the third location with a laser beam.

18. The method of claim 1, wherein the first location is disposed at a first material of the substrate, the second location is disposed at a second material of the substrate, and the third location is disposed at a third material of the substrate, wherein the second material includes a different material than does the first material and the third material.

19. The method of claim 1, wherein at least one of the first location, the second location, and the third location is embedded within the substrate.

20. The method of claim 1, wherein the acoustic wave is either a single wavelength wave or a wave packet.

21. A system for modifying an acoustic wave comprising:
   a heater thermally coupled to a substrate, the substrate having a first location and a second location; and
   a controller coupled to the heater, the controller configured so as to:
      initiate excitation of an acoustic wave from the first location on to the second location; and
      selectively heat, independently of the initiated excitation of the acoustic wave, the second location of the substrate so as to alter a property of the second location, the altered property of the second location modifying the acoustic wave to result in a modified acoustic wave that is propagated from the second location to a third location on the substrate.

22. The system of claim 21, wherein the selectively heating is initiated subsequent or prior to the initiation of excitation of the acoustic wave but prior to the acoustic wave arrival at the second location on the substrate.

23. The system of claim 21, wherein the controller is further configured to:
selectively heat the third location of the substrate so as to alter a property of the third location, the altered property of the third location further modifying the acoustic wave to result in a further modified acoustic wave that is propagated from the third location to a fourth location on the substrate.

24. The system of claim 21, wherein the acoustic wave includes a surface acoustic wave.

25. The system of claim 21, wherein the acoustic wave includes a bulk acoustic wave.

26. The system of claim 21, wherein the altered property is selected from the group consisting of a thermal property, a mechanical property, and a chemical property.

27. The system of claim 21, wherein the altered property of the second location focuses or defocuses the acoustic wave at the third location.

28. The system of claim 21, wherein the altered property of the second location redirects a path of the acoustic wave toward the third location.

29. The system of claim 21, wherein the altered property of the second location shifts a phase of the acoustic wave.

30. The system of claim 21, wherein the first location of the substrate includes a first set of interdigitated electrodes configured to initiate the acoustic wave responsive to a first voltage applied across the first set of interdigitated electrodes.

31. The system of claim 30, wherein the third location of the substrate includes a second set of interdigitated electrodes configured to generate a second voltage across the second set of interdigitated electrodes responsive to receipt of the modified acoustic wave.

32. The system of claim 21, wherein the heater comprises a short or a long pulsed laser or a continuous laser.

33. The system of claim 21, wherein the heater comprises an electron beam source.

34. The system of claim 21, wherein the heater comprises a resistive heater in contact with the second location of the substrate.

35. The system of claim 21, wherein the heater comprises means for initiating a chemical reaction that produces heat at the second location of the substrate.

36. The system of claim 21, wherein the first location is disposed at a first material of the substrate, the second location is disposed at a second material of the substrate, and the third location is disposed at a third material of the substrate, wherein the second material includes a different material than does the first material and the third material.

37. The system of claim 21, further comprising a sensor configured to sense the modified acoustic wave at the third location.

38. The system of claim 37, wherein the sensor comprises a laser configured to irradiate the third location with a laser beam.

39. The system of claim 21, wherein at least one of the first location, the second location, and the third location is embedded within the substrate.

40. The system of claim 21, wherein the acoustic wave is either a single wavelength wave or a wave packet.

41. The method of claim 1, wherein the modified acoustic wave is propagated laterally from the second location to the third location in the substrate.

42. The system of claim 21, wherein a top surface of the substrate defines a horizontal plane and the modified acoustic wave is propagated in a direction parallel to the horizontal plane.

* * * * *